US009735117B2

(12) United States Patent
Smith et al.

(10) Patent No.: US 9,735,117 B2
(45) Date of Patent: Aug. 15, 2017

(54) DEVICES AND METHODS RELATED TO INTERCONNECT CONDUCTORS TO REDUCE DE-LAMINATION

(71) Applicant: Skyworks Solutions, Inc., Woburn, MA (US)

(72) Inventors: Kim Rene Smith, Acton, MA (US); Paul T. DiCarlo, Marlborough, MA (US); Michael David Hill, Frederick, MD (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 13/744,250

(22) Filed: Jan. 17, 2013

(65) Prior Publication Data
US 2013/0221501 A1 Aug. 29, 2013

Related U.S. Application Data

(60) Provisional application No. 61/588,999, filed on Jan. 20, 2012.

(51) Int. Cl.
*H01L 23/00* (2006.01)
*H01L 23/60* (2006.01)
(Continued)

(52) U.S. Cl.
CPC .............. *H01L 23/66* (2013.01); *H01L 23/60* (2013.01); *H01L 24/03* (2013.01); *H01L 24/05* (2013.01); *H01L 25/18* (2013.01); *H01L 27/0255* (2013.01); *H01L 27/0292* (2013.01); *H01L 29/66143* (2013.01); *H01L 29/868* (2013.01); *H01L 29/872* (2013.01); *H04B 1/16* (2013.01); *H01L 29/6609* (2013.01); (Continued)

(58) Field of Classification Search
CPC ..... H01L 2224/8011; H01L 2224/8111; H01L 24/02; H01L 24/04; H01L 24/05; H01L 24/06; H01L 24/13; H01L 24/14; H01L 24/18; H01L 24/34; H01L 23/522; H01L 23/562; H01L 2224/8211; H01L 2224/8311; H01L 29/408; H01L 23/60
USPC .......................................... 257/779; 438/612
See application file for complete search history.

(56) References Cited

U.S. PATENT DOCUMENTS 4,840,302 A * 6/1989 Gardner et al. ........... 228/123.1
5,477,087 A * 12/1995 Kawakita et al. ............ 257/737
(Continued)

*Primary Examiner* — David Zarneke
(74) *Attorney, Agent, or Firm* — Knobbe, Martens, Olson & Bear LLP

(57) ABSTRACT

Disclosed are systems, devices and methods for utilizing an interconnect conductor to inhibit or reduce the likelihood of de-lamination of a passivation layer of an integrated circuit die. In some implementations, a metal layer in ohmic contact with an intrinsic region of a semiconductor substrate can be partially covered by a passivation layer such as a dielectric layer. An interconnect conductor electrically connected to the metal layer can include an extension that covers an edge of the passivation layer to thereby inhibit the edge from lifting up. In some implementations, the metal layer in combination with a contact pad also in ohmic contact with the intrinsic region can yield a conduction path through the intrinsic region during an electrostatic discharge (ESD) event. In such a configuration, the interconnect conductor can route the ESD charge to a ground.

19 Claims, 16 Drawing Sheets

(51) Int. Cl.
    *H01L 23/522* (2006.01)
    *H01L 23/66* (2006.01)
    *H01L 29/872* (2006.01)
    *H01L 29/66* (2006.01)
    *H01L 27/02* (2006.01)
    *H01L 25/18* (2006.01)
    *H01L 29/868* (2006.01)
    *H04B 1/16* (2006.01)
    *H01L 29/861* (2006.01)

(52) U.S. Cl.
    CPC .... *H01L 29/861* (2013.01); *H01L 2223/6644* (2013.01); *H01L 2223/6677* (2013.01); *H01L 2223/6683* (2013.01); *H01L 2224/05554* (2013.01); *H01L 2924/10329* (2013.01); *H01L 2924/1205* (2013.01); *H01L 2924/12031* (2013.01); *H01L 2924/12032* (2013.01); *H01L 2924/1306* (2013.01); *H01L 2924/1423* (2013.01); *H01L 2924/30205* (2013.01)

(56) References Cited

U.S. PATENT DOCUMENTS

| | | | |
|---|---|---|---|
| 7,659,145 B2 * | 2/2010 | Do | H01L 21/568 438/109 |
| 7,728,422 B2 * | 6/2010 | Kim | G06K 19/07743 257/678 |
| 7,855,458 B2 * | 12/2010 | Matsumoto | H01G 4/008 257/368 |
| 2002/0057610 A1 | 5/2002 | Baliga | |
| 2007/0278518 A1 | 12/2007 | Chen et al. | |
| 2008/0055015 A1 | 3/2008 | Blednov | |
| 2008/0174924 A1 | 7/2008 | Kang et al. | |
| 2008/0230903 A1 * | 9/2008 | Sato | 257/738 |
| 2010/0078777 A1 | 4/2010 | Barth et al. | |
| 2010/0133687 A1 * | 6/2010 | Lin et al. | 257/737 |
| 2010/0200837 A1 * | 8/2010 | Zimmerman et al. | 257/13 |
| 2010/0259346 A1 | 10/2010 | Runyon | |
| 2011/0026174 A1 | 2/2011 | Klein et al. | |
| 2011/0278732 A1 | 11/2011 | Yu et al. | |

* cited by examiner

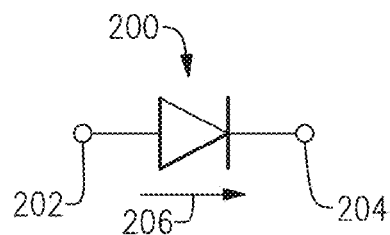
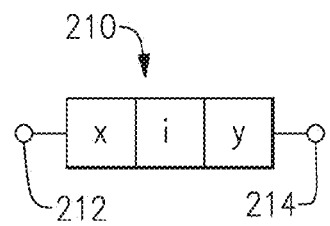
FIG.3A
FIG.3B
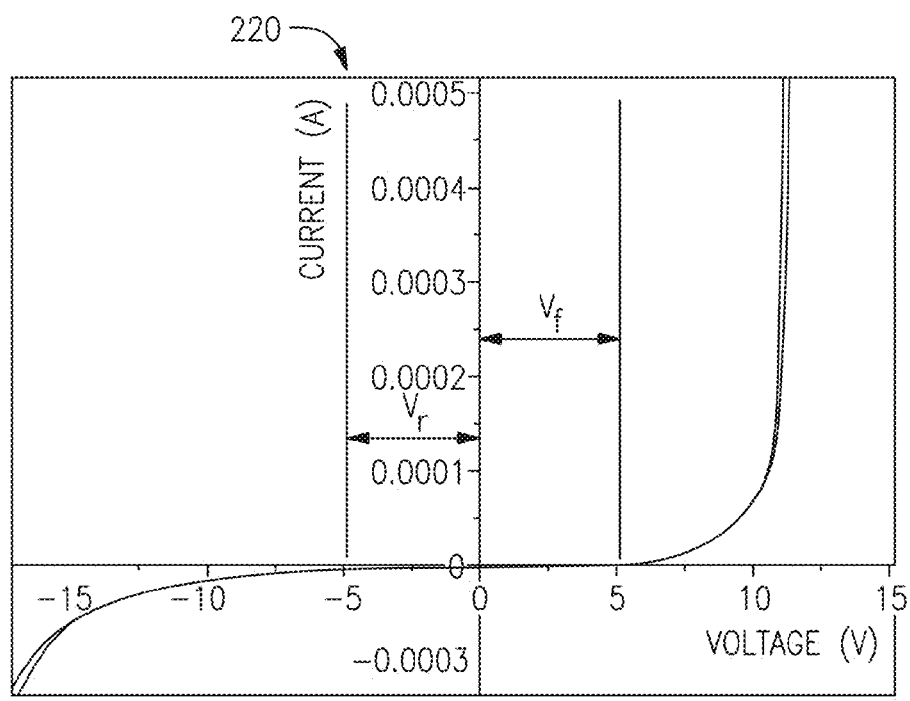
FIG.4

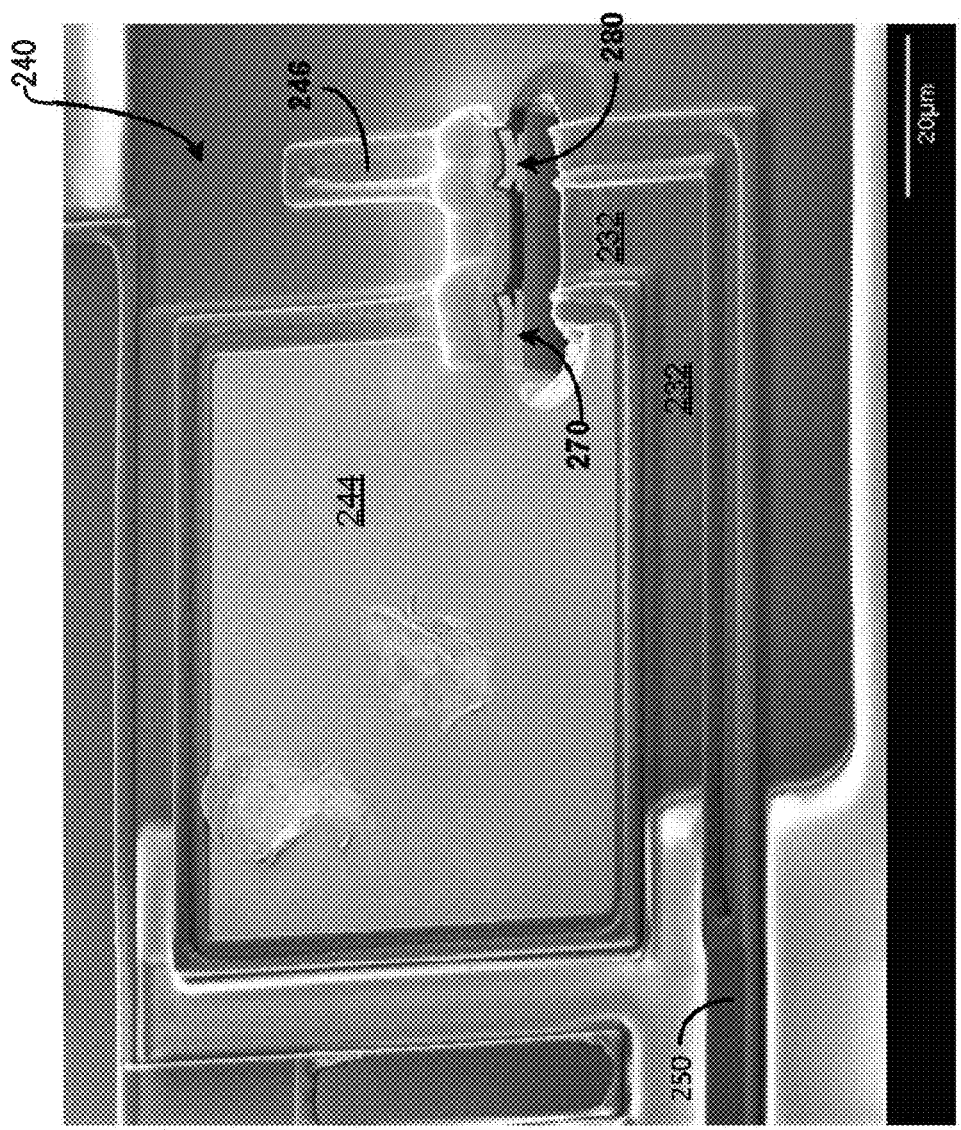

DEVICES AND METHODS RELATED TO INTERCONNECT CONDUCTORS TO REDUCE DE-LAMINATION

RELATED APPLICATIONS

This application is a non-provisional of and claims priority to U.S. Provisional Application No. 61/588,999, filed on Jan. 20, 2012, entitled "DEVICES AND METHODOLOGIES RELATED TO ELECTROSTATIC DISCHARGE PROTECTION BENIGN TO RF OPERATION," which is hereby incorporated herein by reference in its entirety.

BACKGROUND

Field

The present disclosure generally relates to the field of semiconductor technology, and more particularly, to electrostatic discharge protection for semiconductor devices.

Description of the Related Art

Electrostatic discharge (ESD) is a sudden and usually undesirable flow of charge between two objects at different electrical potentials. ESD can be harmful to solid state electronics such as integrated circuits.

Some portions of an integrated circuit (IC) can be equipped with ESD protection devices such as diodes. However, such devices typically affect radiofrequency (RF) properties of the IC.

SUMMARY

In a number of implementations, the present disclosure relates to a device that includes a semiconductor substrate having an intrinsic region. The device further includes a circuit disposed on the semiconductor substrate. The device further includes a first conductor disposed relative to the intrinsic region and electrically connected to the circuit. The device further includes a second conductor disposed relative to the intrinsic region and the first conductor. The second conductor is configured so that a potential difference greater than a selected value between the first and second conductors results in a conduction path through the intrinsic region between the first and second conductors.

In some embodiments, the device can be a semiconductor die. The substrate can further include an insulating region disposed between the first and second conductors and above the intrinsic region so that the conduction path through the intrinsic region is away from a surface of the substrate.

In some embodiments, the device can further include a ground that is electrically connected to the second conductor. In some embodiments, each of the first and second conductors can be formed from metal such that the conduction path includes a metal-semiconductor-metal junction. The metal-semiconductor-metal junction can include a first turn-on voltage for conduction along a first direction between the first and second conductors. The metal-semiconductor-metal junction can further include a second turn-on voltage for conduction along a second direction between the first and second conductors. The first and second turn-on voltages can have different magnitudes. The magnitude of the first turn-on voltage can be lower than the magnitude of the second turn-on voltage. The conduction along the first direction can include conduction from the first conductor to the second conductor through the intrinsic region. The first turn-on voltage can be selected to facilitate the conduction along the first direction when the circuit is subjected to an electrostatic discharge (ESD) but not significantly interfere with operation of the circuit when not subjected to the EDS.

In some embodiments, each of the first and second conductors can form an ohmic contact with the intrinsic region. The intrinsic region can include a bulk intrinsic region that allows injection of charge through at least one of the first and second conductors. The first and second conductors can be configured to favor the injection of charge into the bulk intrinsic region through the first conductor during an electrostatic discharge (ESD). The second conductor can be geometrically configured to facilitate the favored injection of charge through the first conductor. The bulk intrinsic region and the second conductor's geometric configuration can be configured such that capacitance resulting from the second conductor has a substantially negligible effect on operation of the circuit when not subjected to the EDS. The operation of the circuit can include a radio-frequency (RF) operation when not subjected to the EDS.

In some embodiments, the semiconductor substrate can include first and second sides that face substantially opposite directions. Both of the first and second conductors can be positioned on the first side of the semiconductor substrate. At least one of the first and second conductors can be formed directly on a surface of the first side of the semiconductor substrate. At least one of the first and second conductors can be formed within a recessed feature defined on the first side of the semiconductor substrate. The first conductor can be part of an epitaxial structure formed on the first side of the semiconductor substrate.

In some embodiments, the first conductor can be positioned on the first side of the semiconductor substrate and the second conductor can be positioned on the second side of the semiconductor substrate. At least one of the first and second conductors can be formed within a recessed feature defined on the side associated with the conductor. The recessed feature can be dimensioned to provide a desirable dimension of the intrinsic region between the first and second conductors.

In some embodiments, the circuit can include a radio-frequency (RF) circuit. The first conductor can include a contact pad configured to receive an input RF signal for the RF circuit. The second conductor can be configured as a strip that extends at least partially around the contact pad's perimeter. The contact pad can have a substantially rectangular shape, and the strip can include a substantially right-angle corner positioned at a selected distance from one of the corners of the rectangular-shaped contact pad.

In some embodiments, the RF circuit can include a low-noise amplifier (LNA) and/or a passive device configured to facilitate operation of the RF circuit. The passive device can include, for example, a capacitor such as a DC-blocking capacitor and/or a resistor.

In some embodiments, the semiconductor substrate can include gallium arsenide (GaAs). Other types of semiconductor substrate can also benefit from one or more features of the present disclosure.

According to some implementations, the present disclosure relates to a method for fabricating a semiconductor device. The method includes providing a semiconductor substrate having an intrinsic region. The method further includes forming a first conductor at a first location relative to the intrinsic region. The method further includes forming a second conductor at a second location relative to the intrinsic region to form a discharge path through the intrinsic region between the first and second conductors. The discharge path is capable of passing current when a potential difference between the first and second conductors exceeds a selected value.

In some embodiments, the forming of the first conductor and the forming of the second conductor each can include forming an ohmic contact between the respective conductor and the intrinsic region. In some embodiments, the method can further include forming an insulating region between the first and second conductors such that the discharge path through the intrinsic region is below the insulating region.

In some implementations, the present disclosure relates to a semiconductor die that includes a substrate configured to receive a plurality of components, with the substrate having an intrinsic region. The die further includes a first conductor disposed relative to the intrinsic region. The die further includes a second conductor disposed relative to the intrinsic region and the first conductor. The second conductor is configured so that a potential difference greater than a selected value between the first and second conductors results in a conduction path through the intrinsic region between the first and second conductors.

In accordance with some implementations, the present disclosure relates to a radio-frequency (RF) module that includes a packaging substrate configured to receive a plurality of components. The module further includes a die mounted on the packaging substrate. The die includes a radio-frequency (RF) circuit and an intrinsic region. The die further includes a first conductor and a second conductor disposed relative to the intrinsic region. The first and second conductors are configured so that a potential difference greater than a selected value between the first and second conductors results in a conduction path through the intrinsic region between the first and second conductors.

In some embodiments, the module can further include a ground plane electrically connected to the second conductor.

In a number of teachings, the present disclosure relates to a wireless device that includes an antenna, and a receiver circuit coupled to the antenna and configured to process a radio-frequency (RF) signal. The wireless device further includes a monolithic microwave integrated circuit (MMIC) configured to facilitate the processing of the RF signal. The MMIC includes a semiconductor substrate with an intrinsic region and an RF circuit disposed on the semiconductor substrate. The MMIC further includes a first conductor disposed relative to the intrinsic region and electrically connected to the RF circuit. The MMIC further includes a second conductor disposed relative to the intrinsic region. The first and second conductors are configured so that a potential difference greater than a selected value between the first and second conductors results in a conduction path through the intrinsic region between the first and second conductors.

In some embodiments, the RF circuit can include a low noise amplifier (LNA). In some embodiments, the wireless device can further include a transmitter circuit coupled to the antenna and configured to generate a transmit RF signal.

In a number of implementations, the present disclosure relates to a structure for electrostatic discharge (ESD) protection. The structure includes an ohmic metal disposed on an intrinsic semiconductor substrate and positioned adjacent to a location on the intrinsic semiconductor substrate susceptible to an ESD. The structure is configured to be substantially benign electrically to radiofrequency (RF) signals passing through the location.

In some implementations, the present disclosure relates to a device that includes a die having a semiconductor substrate with an intrinsic region. The device further includes a metal layer in ohmic contact with the intrinsic region. The device further includes a passivation layer formed over the metal layer and the intrinsic region. The passivation layer defines an opening dimensioned to expose at least a portion of the metal layer. The device further includes an interconnect conductor disposed over the metal layer and electrically connected to the metal layer through the opening. The interconnect conductor includes an extension that extends over an edge of the opening of the passivation layer to inhibit or reduce the likelihood of the passivation layer de-laminating from the edge.

In some embodiments, the passivation layer can include a dielectric layer. In some embodiments, the interconnect conductor can be connected to a ground.

In some embodiments, the device can further include a radio-frequency (RF) circuit implemented on the die. In some embodiments, the device can further include a contact pad connected to the RF circuit and in ohmic contact with the intrinsic region. The contact pad and the metal layer can be configured so that a potential difference greater than a selected value between the contact pad and the metal layer results in a conduction path through the intrinsic region between the contact pad and the metal layer. The conduction path can include a metal-semiconductor-metal junction. The metal-semiconductor-metal junction of the conduction path can be configured to provide a discharge path during an electrostatic discharge (ESD) event.

In some embodiments, the contact pad can be configured to receive an input RF signal for the RF circuit. The RF circuit can include a low-noise amplifier (LNA).

In some embodiments, the interconnect conductor can be configured as a strip that extends near a perimeter of the die. In some embodiments, the semiconductor substrate can include gallium arsenide (GaAs). Other types of semiconductor substrate can also benefit from one or more features of the present disclosure.

According to a number of implementations, the present disclosure relates to a method for fabricating a semiconductor device. The method includes providing a semiconductor substrate having an intrinsic region. The method further includes forming metal layer in ohmic contact with the intrinsic region. The method further includes forming a passivation layer over the metal layer and the intrinsic region such that the passivation layer defines an opening dimensioned to expose at least a portion of the metal layer. The method further includes forming an interconnect conductor over the metal layer such that the interconnect conductor is electrically connected to the metal layer. The interconnect conductor includes an extension that extends over an edge of the opening of the passivation layer to inhibit or reduce the likelihood of the passivation layer de-laminating from the edge.

In some embodiments, the method can further include forming a radio-frequency circuit on the semiconductor substrate. In some embodiments, the method can further include forming and connecting a contact pad to the RF circuit. The contact pad can be in ohmic contact with the intrinsic region. The contact pad and the metal layer can be configured so that a potential difference greater than a selected value between the contact pad and the metal layer results in a conduction path through the intrinsic region between the contact pad and the metal layer. In some embodiments, the passivation layer can include a dielectric layer.

According to some implementations, the present disclosure relates to a radio-frequency (RF) module that includes a packaging substrate configured to receive a plurality of components. The module further includes a semiconductor die mounted on the packaging substrate. The die includes an intrinsic region. The die further includes a metal layer in ohmic contact with the intrinsic region. The die further includes a passivation layer formed over the metal layer and the intrinsic region. The passivation layer defines an opening dimensioned to expose at least a portion of the metal layer. The die further includes an interconnect conductor disposed over the metal layer and electrically connected to the metal layer through the opening. The interconnect conductor includes an extension that extends over an edge of the opening of the passivation layer to inhibit or reduce the likelihood of the passivation layer de-laminating from the edge.

In some embodiments, the module can further include a ground plane electrically connected to the interconnect conductor. In some embodiments, the module can further include a radio-frequency (RF) circuit implemented on the die.

In some embodiments, the module can further include a contact pad connected to the RF circuit and in ohmic contact with the intrinsic region. The contact pad and the metal layer can be configured so that a potential difference greater than a selected value between the contact pad and the metal layer results in a conduction path through the intrinsic region between the contact pad and the metal layer.

In a number of implementations, the present disclosure relates to a wireless device that includes an antenna, and a receiver circuit coupled to the antenna and configured to process a radio-frequency (RF) signal. The wireless device further includes a monolithic microwave integrated circuit (MMIC) configured to facilitate the processing of the RF signal. The MMIC includes a semiconductor substrate with an intrinsic region and an RF circuit disposed on the semiconductor substrate. The MMIC further includes a metal layer in ohmic contact with the intrinsic region. The MMIC further includes a passivation layer formed over the metal layer and the intrinsic region. The passivation layer defines an opening dimensioned to expose at least a portion of the metal layer. The MMIC further includes an interconnect conductor disposed over the metal layer and electrically connected to the metal layer through the opening. The interconnect conductor includes an extension that extends over an edge of the opening of the passivation layer to inhibit or reduce the likelihood of the passivation layer de-laminating from the edge.

In some embodiments, the RF circuit can include a low noise amplifier (LNA).

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 13/744,297, titled "DEVICES AND METHODS RELATED TO ELECTROSTATIC DISCHARGE PROTECTION BENIGN TO RADIO-FREQUENCY OPERATION," filed on even date herewith and hereby incorporated by reference herein in its entirety.

BRIEF DESCRIPTION OF THE DRAWINGS

FIG. 3A shows that in some implementations, the discharge structure of FIGS. 1 and 2 can be characterized as a diode configured to provide an ESD path under certain conditions.

FIG. 3B shows that in some embodiments, the diode of FIG. 3A can be characterized as having functionality similar to, for example, a p-i-n diode.

FIG. 4 shows an example I-V curve having different forward and reverse turn-on voltages of an example ESD structure.

FIG. 7A shows a closer view, including a sectional view, of the example ESD structure of FIG. 6.

DETAILED DESCRIPTION OF SOME EMBODIMENTS

Figure 1A:
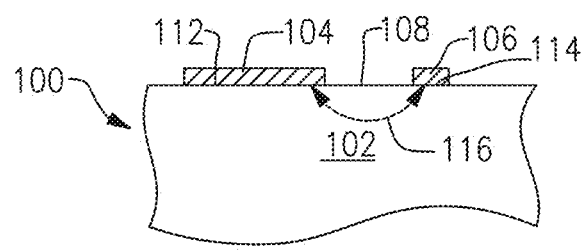
FIGS. 1A-1E show examples of an electrostatic discharge (ESD) structure that includes first and second conductors with an intrinsic semiconductor region therebetween.

The headings provided herein, if any, are for convenience only and do not necessarily affect the scope or meaning of the claimed invention.

Described herein are various examples of devices and methods related to an electrostatic discharge (ESD) structure. ESD is generally understood to be a relatively sudden and momentary flow of electrical current between two locations at different electrical potentials.

In the context of electronics, such unwanted current can damage devices such as integrated circuits (ICs). Such ICs are often formed from semiconductor materials such as silicon and gallium arsenide (GaAs), and such semiconductor materials themselves can suffer damage when subjected to sufficiently high voltages.

To reduce occurrence of ESDs and/or to mitigate damages resulting from ESDs, antistatic devices and/or ESD protection devices can be provided or formed on IC devices. In some situations, such devices can affect how an IC device operates. For example, an IC that is configured for radio-frequency (RF) operation can be affected by an ESD protection device in an adverse manner.

As described herein, an ESD structure can be formed on a semiconductor substrate so as to provide a desirable ESD protection functionality while not significantly impacting other properties such as RF-related properties. In some implementations, such a structure can include a semiconductor substrate. First and second conductors can be disposed on the substrate such that an intrinsic semiconductor region is between the two conductors.

Under some conditions, such an arrangement can result in a conduction path being formed through the intrinsic region between the two conductors. Such conditions can include a situation where an electrical potential difference between the first and second conductors exceeds a selected value. As described herein, such a value can be selected so as to allow conduction through the intrinsic region under, for example, an ESD condition. Under normal operating conditions, the intrinsic region can substantially insulate the two conductors from each other. Further, and as described herein, an ESD structure can be configured so as to yield relatively low capacitance that has reduced or substantially insignificant effect on normal operation (such as RF operation) of an IC.

In some embodiments, the first conductor can be part of an IC and/or be a part configured to facilitate electrical connection for the IC. The second conductor can be electrically connected to a ground or any other suitably configured charge sink. Thus, when an ESD event occurs at the first conductor, the pathway created by the ESD condition allows the excess charge to be routed to the second conductor through the intrinsic region and away from the IC. Examples of such first and second conductors and various configurations are described herein in greater detail.

FIGS. 1A-1E show non-limiting examples of how the first and second conductors can be arranged on a semiconductor substrate. In an example configuration 100 of FIG. 1A, a first conductor 104 and a second conductor 106 can be disposed on a first surface 108 (such as a top surface) of a semiconductor substrate 102. In some embodiments, each of the first and second conductors 104, 106 can include metal that forms an ohmic contact (112, 114) with the semiconductor substrate 102.

In some implementations, the semiconductor substrate 102 can include an intrinsic region such that at least a portion of each of the ohmic contacts formed by the first and second conductors 104, 106 is with the intrinsic region. In some embodiments, substantially all of the first and second conductors' ohmic contacts can be on different portions of the intrinsic region of the substrate 102. In some embodiments, and as described herein, an intrinsic region can be configured so as to provide an electrical pathway between the first and second conductors 104, 106 under some conditions.

As shown in FIG. 1A, the configuration 100 having the foregoing properties can yield an electrical conduction pathway 116 between the first and second conductors 104, 106 through the intrinsic region of the substrate 102. As described herein, such a conduction pathway can remain off (e.g., substantially insulating) under normal operating conditions, and advantageously be turned on for conduction under selected conditions such as during an ESD event. The example conduction pathway 116 is depicted as being capable of conducting electricity both ways between the first and second conductors 104, 106. In some embodiments as described herein, electrical current flow in one direction can be favored over the other direction so as to yield a desirable ESD protection functionality where the current flows away from an area being protected.

Figure 1B:
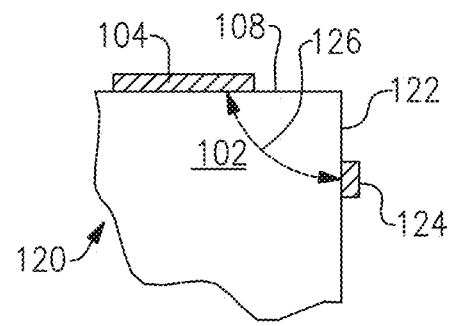

In an example configuration 120 of FIG. 1B, a first conductor 104 can be disposed on a first surface 108 (such as a top surface) of a semiconductor substrate 102 in a manner similar to that of FIG. 1A. In this example, a second conductor 124 can be disposed on a second surface 122 (such as a side surface adjacent the top surface) of the same substrate 102. In the example of FIG. 1B, the top surface 108 can be a main surface where various IC components are formed, and the side surface 122 can be, for example, a side wall surface of an edge. In some embodiments, one or both of the conductors 104, 124 can be configured to form ohmic contact(s) with the substrate 102 in a manner similar to the example of FIG. 1A. In some implementations, the semiconductor substrate 102 can include an intrinsic region so as to yield properties and/or functionalities similar to the example configuration 100 of FIG. 1A, including the advantageous turning on of an electrical conduction pathway 126 under selected conditions such as an ESD event.

Figure 1C:
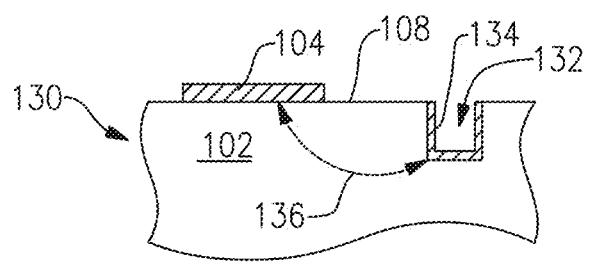

In an example configuration 130 of FIG. 1C, a first conductor 104 can be disposed on a first surface 108 (such as a top surface) of a semiconductor substrate 102 in a manner similar to that of FIG. 1A. In this example, a second conductor 134 can be disposed on a feature such as a via 132 formed on the first surface 108. In some embodiments, one or both of the conductors 104, 134 can be configured to form ohmic contact(s) with the substrate 102 in a manner similar to the example of FIG. 1A. In some implementations, the semiconductor substrate 102 can include an intrinsic region so as to yield properties and/or functionalities similar to the example configuration 100 of FIG. 1A, including the advantageous turning on of an electrical conduction pathway 136 under selected conditions such as an ESD event.

Figure 1D:
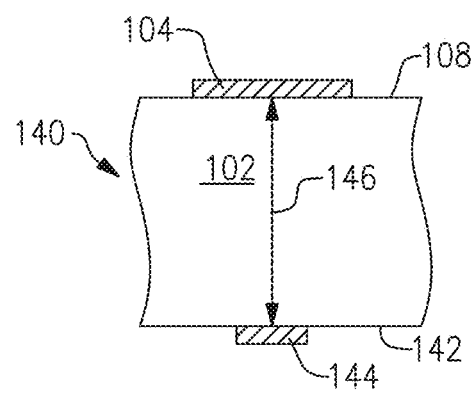

FIG. 1D depicts another example configuration 140 where a first conductor 104 can be disposed on a first surface 108 (such as a top surface) of a semiconductor substrate 102 in a manner similar to that of FIG. 1A. A second conductor 144 is depicted as being disposed on the opposite surface 142 (such as a bottom surface) of the semiconductor substrate 102. In some implementations, the top surface 108 of the substrate 102 can include various IC components. In some embodiments, one or both of the conductors 104, 144 can be configured to form ohmic contact(s) with the substrate 102 in a manner similar to the example of FIG. 1A. In some implementations, the semiconductor substrate 102 can include an intrinsic region so as to yield properties and/or functionalities similar to the example configuration 100 of FIG. 1A, including the advantageous turning on of an electrical conduction pathway 146 under selected conditions such as an ESD event.

As described herein, the turning on of an electrical conduction pathway through an intrinsic semiconductor region can be triggered by an electrical potential difference between first and second conductors exceeding a selected value. Such a selected value can depend on factors that include, but not limited to, distance between the conductors, composition of the intrinsic semiconductor, and dimensions of the conductors. Accordingly, a design of an ESD protection structure can be based on one or more of these factors.

Figure 1E:
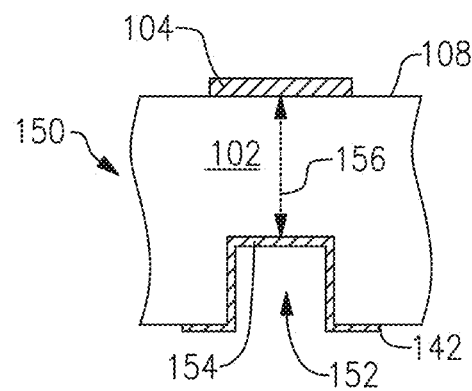

For example, suppose that the substrate 102 of FIG. 1D forms a die having a given thickness. Such a thickness may be result in a turn-on potential that is too high. To lower the turn-on potential, the two conductors can be positioned closer to each other as depicted in FIG. 1E, where an example configuration 150 includes a second conductor 154 that is positioned closer to a first conductor 104 (on a first surface 108 such as a top surface) by being disposed in a recess 152 (such as a via or a depression) defined by a second surface 142 (such as a bottom surface). Accordingly, a conduction path 156 through an intrinsic region of a semiconductor substrate 102 can be turned on at a suitable potential difference. In some embodiments, such a suitable potential difference can be lower than that of a configuration where the second conductor is formed on the second surface (assuming similar thickness and composition of the substrates) and thus separated further from the first conductor.

In another example, and as described herein in greater detail, shapes and sizes of the first and second conductors can be selected to provide functionalities such as, but not limited to, a desired turn-on profile while having a reduced or substantially nil contribution in one or more radio-frequency (RF) affecting parameters (e.g., capacitance). In some embodiments, and as further described herein, such a desired turn-on profile can be configured so as to favor one conduction path direction over the other.

In the examples described in reference to FIGS. 1A-1E, various conductors are depicted as being formed directly on their respective surfaces of semiconductor substrates. It will be understood, however, that such a feature is not a requirement.

Figure 2:
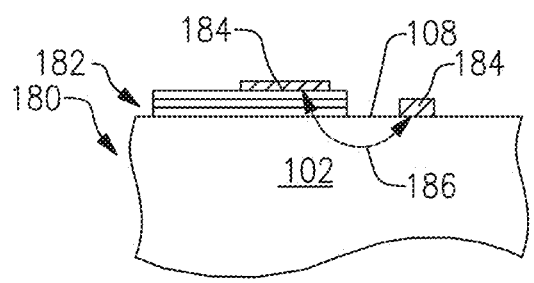
FIG. 2 shows that in some implementations, one or more conductors of the ESD structure can be formed as part of an epitaxial layer.

For example, as shown in a configuration 180 of FIG. 2, a first conductor for facilitating a selected turned-on conduction through an intrinsic semiconductor region of a substrate 102 can be disposed on a structure 182 (such as epitaxial layers) that is formed on a first surface 108 (such as a top surface) of the substrate 102. In the example shown, a second conductor 184 is also disposed on the top surface 108 of the substrate 102. In some embodiments, the conductors 102, 184 can be configured to form ohmic contacts with their respective surfaces. In some implementations, the epi-layers structure 182 and the semiconductor substrate 102 can include intrinsic regions so as to yield properties and/or functionalities similar to the example configurations of FIGS. 1A-1E, including the advantageous turning on of an electrical conduction pathway 186 under selected conditions such as an ESD event.

In some implementations, the various example structures described in reference to FIGS. 1 and 2 can include a feature where an electrical conduction pathway is established when the potential difference between the two conductors exceeds some threshold value. Further, such a conduction pathway can be directional such that current flow is allowed one way (e.g., from the first conductor to the second conductor) but inhibited or reduced in the opposite direction.

While it is not desired or intended to be bound by any particular theory or model, a device having one or more features described herein can be characterized as a diode 200 as depicted in FIG. 3A. Such a diode can be configured so as to allow current flow only in one direction (e.g., arrow 206) when its two terminals 202, 204 are biased appropriately (e.g., forward bias greater than a threshold value).

In the context of a conduction pathway being through an intrinsic semiconductor material, the diode 200 of FIG. 3A can be represented as an x-i-y type diode 210 depicted in FIG. 3B, where each of x and y can be n-type or p-type. In some embodiments, x and y can be the same type of material. For example, if ohmic contacts formed by the first and second conductor include n-type interfaces between the conductors' metals and the intrinsic semiconductor, then the diode 210 can be an n-i-n diode. Similarly, a p-i-p diode can also be implemented.

Again, while it is not desired or intended to be bound by any particular theory or model, the example diode's first terminal 212 can correspond to the first conductor (e.g., 104 and 184 in FIGS. 1 and 2), and the second terminal 214 to the second conductor (e.g., 106, 124, 134, 144, 154, and 184). Accordingly, the first conductor can form an ohmic contact with the intrinsic region so as to include an x-type-intrinsic like junction (with x being p-type or n-type). Similarly, the second conductor can form an ohmic contact with the intrinsic region so as to include a y-type-intrinsic like junction (with y being p-type or n-type).

FIG. 4 shows an I-V curve 220 associated an example structure similar to that of FIG. 1A. A forward current (e.g., from the first conductor 104 to the second conductor 106) is depicted as beginning to turn on at a forward bias voltage of $V_f$. In the example shown, $V_f$ has a value of about 5 volts, and the current's magnitude increases rapidly after about 10 volts. It will be understood that $V_f$ can be selected to be lower or higher.

In the example I-V curve 220, a reverse current is shown to turn on at a reverse bias voltage $V_r$. In the example shown, $V_r$ has a value of about −5 volts, and the current's magnitude increases at a slower rate than that of the forward current. It will be understood that $V_r$ can be selected to be lower or higher.

In some implementations, and as shown in FIG. 4, an asymmetry in the I-V curve, in the context of magnitudes of $V_f$ and $V_r$ and/or current-increase profiles, can be due to differences in the first and second conductors. For example, differences in ohmic contact areas of the two conductors can yield such an asymmetry. Accordingly, first and/or second conductors can be configured so as to yield a desired I-V profile that provides, for example, a funnel-like functionality where charge can fill the intrinsic region easier through one conductor (e.g., first conductor) than the other conductor (e.g., second conductor). Such a functionality can provide ESD protection by diverting the charge away from the first conductor to the second conductor, while making the reverse flow of charge (from the second conductor to the first conductor) less likely.

In some implementations, the foregoing example of configuring one or more of the conductors about an intrinsic semiconductor region to achieve a desired charge flow can be part of a systematic approach to ESD protection. Such an approach can be designed and implemented so as to allow a discharge structure to work in conjunction with one or more existing structures to allow build up and discharge of charge in a desirable manner. For example, an existing bond pad can act as a first conductor, and a discharge conductor acting as a second conductor can be dimensioned and positioned relative to the bond pad so as to achieve a desired discharge property.

In another example, a discharge conductor can be dimensioned and positioned relative to a passive device where charge buildup is likely. For example, a discharge conductor can be positioned relative to a capacitor or a resistor so as to allow discharge of charge from such a device to the discharge conductor.

In some implementations, an existing structure or device can be configured to further increase the robustness of ESD protection, and/or to provide greater control in how such ESD protection can be effectuated. For example, suppose that a MIM (metal-insulator-metal) capacitor is provided in a circuit design, and that it is not desirable to have an ESD occur at or close to a selected conductor (e.g., an adjacent ohmic metal such as a contact to a resistor or a source/drain metal). If such a selected conductor is formed with ohmic contact with an intrinsic semiconductor substrate shared with a bottom metal (also in ohmic contact with the intrinsic semiconductor substrate) of the MIM capacitor, an unintentional ESD pathway can be provided between the capacitor and the selected conductor as described herein. To inhibit such a discharge path, a MIM capacitor can be configured so that its bottom metal layer is positioned on, for example, a nitride layer instead of directly on the intrinsic semiconductor. Such a nitride layer can inhibit or reduce the likelihood of discharge from the metal of the capacitor into the semiconductor through body or surface charge states.

In some implementations, a discharge conductor can be positioned relative to an intrinsic semiconductor region so as to yield a desired ESD protection functionality. For example, effectiveness of a discharge conductor in receiving charge can be increased by a selectively orienting the discharge conductor with an average crystal orientation of the semiconductor substrate (e.g., GaAs). In the context of a strip-shaped discharge conductor, generally aligning the strip extension direction with a selected crystal orientation can improve the effectiveness of charge transfer between the strip conductor and the semiconductor substrate (e.g., the strip conductor receiving charge from the semiconductor substrate). Such a configuration can be based on a property of electrical conduction varying with crystal orientation. In some implementations, transistors are sometimes oriented to take advantage of such a property. Similarly, a discharge structure can also be oriented to take advantage of such a property.

Figure 5:
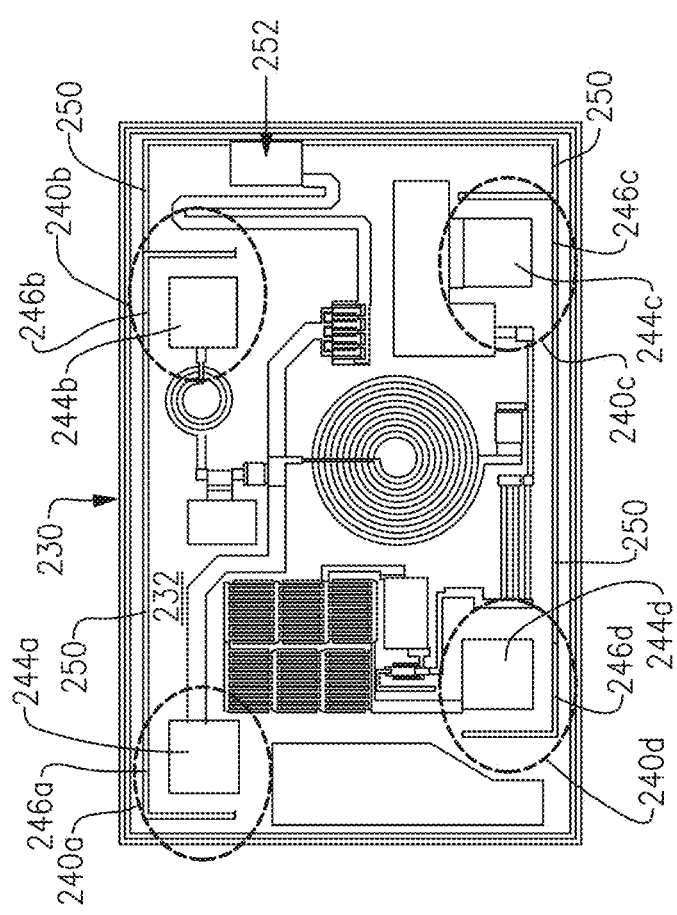
FIG. 5 shows an example integrated circuit device having one or more ESD structures configured to provide ESD protection.
Figure 6:
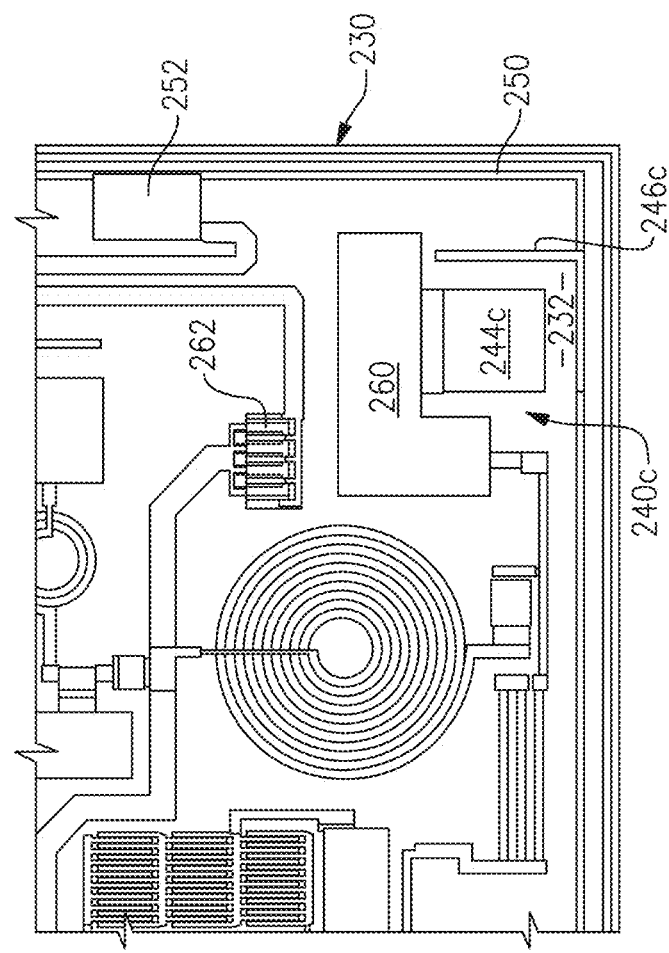
FIG. 6 shows an enlarged view of the device of FIG. 5, where an ESD structure can include a first conductor such as a bond pad and a second conductor separated from the first conductor by an intrinsic semiconductor region.

FIG. 5 shows an example of a device 230 having a number of ESD structures disposed about their respective conductor structures. FIG. 6 shows an enlarged view of one of the example ESD structures and its corresponding conductor structure. It will be understood that a given device can have more or less ESD structures than the four example ESD structures described in reference to FIG. 5.

The example device 230 in FIG. 5 is a monolithic microwave integrated circuit (MMIC). In the example MMIC 230, bond pads (244a, 244b, 244c, 244d) formed on a substrate having an intrinsic region 232 can be considered to be first conductor structures, and their corresponding L-shaped second conductors (246a, 246b, 246c, 246d) yield ESD structures 240a, 240b, 240c, 240d. As shown in the example MMIC 230, the L-shaped second conductors 246 can be electrically connected to a ground plane (not shown) through an interconnect metal trace 250 and a through-wafer via 252. In the plan views of FIGS. 5 and 6, at least a portion of the substrate region between the first and second conductors can include an insulating region on the surface, and the intrinsic region 232 can be located below such an insulating region. Thus, the intrinsic region 232 in ohmic contact with the first and second conductors provides an electrical pathway that can be turned on through the bulk of the intrinsic region and away from the surface.

FIG. 6 shows an enlarged view of the example ESD structure 240c of FIG. 5. As shown, the bond pad 244c acting as a first conductor on the intrinsic region 232 can be electrically connected to one or more devices on the MMIC for which ESD protection is desired. In the example of FIG. 6, a MIM capacitor 260 and an FET (field-effect transistor) 262 are example devices that can be connected to the bond pad 244c such that the bond pad 244c facilitates electrical connectivity for such devices.

FIG. 6 further shows that the second conductor 246c can be disposed relative to the bond pad 244c so as to be separated by at least some intrinsic semiconductor region 232 to thereby provide a pathway for ESD-related charge to pass through the intrinsic region. In some situations, such an ESD-related charge can pass from the bond pad 244c, through the intrinsic region 232 (e.g., underneath an insulating surface area between the first and second conductors 244c, 246c) and to the second conductor 246c, and then to the ground plane (not shown) through the interconnect metal 250 and the through-wafer via 252. As described herein, such a selected direction can be made to be more likely by appropriately dimensioning and positioning the bond pad 244c and/or the second conductor 246c.

In the example shown in FIGS. 5 and 6, the first conductor 244 is depicted as having a rectangular shape, and the second conductor 246 is depicted as having an L-shape that shares its corner with one of the rectangle's corners. It will be understood that other shapes, dimensions and/or arrangements are also possible. Further, the first conductor does not need to be in the form of a bond pad, and can be part of other structures.

In some embodiments, a second conductor can have more or less segments than the example L-shape. For example, a single-segment conductor having a length greater than, equal to, or less than a side of a rectangular shaped bond pad can be positioned along that side so as to be separated by a selected distance. In another example, a three-segment U-shaped conductor can be dimensioned and positioned so that the three segments are adjacent the corresponding three sides of a rectangular shaped bond pad. Other configurations are also possible.

In some embodiments, the first conductor and/or the second conductor can have other shapes. For example, suppose that a first conductor has a circular shape. Then, a second conductor can be an arc having a radius of curvature greater than the radius of the circular first conductor. In some embodiments, such an arc can extend partially around the circumference of the first conductor. Other shaped conductors can also be implemented.

In some embodiments, the first conductor and/or the second conductor can be dimensioned and configured so as to facilitate and/or provide desired ESD protection and/or RF functionality. For example, a second conductor can be shaped so as to facilitate or take advantage of different charge distributions that can form on the first conductor. In some situations, charge can be distributed such that a corner portion of a first conductor yields relatively high electrical field strength. A second conductor can be dimensioned near such a corner so as to utilize or facilitate such different electrical field strengths.

In another example, a second conductor can be dimensioned and shaped so as to yield little or substantially no impact on RF operation and/or noise characteristics of one or more nearby devices. The L-shaped second conductor strips are examples of such conductors that have little or substantially nil impact on RF properties. Examples of such benign-ness in RF properties and/or noise characteristics are described herein in greater detail.

Referring to FIGS. 5 and 6, the interconnect metal 250 is depicted as extending into one end of a segment of the L-shaped conductor 246c and extending from the other end of the segment so as to electrically interconnect the L-shaped conductors 246 to the via 252. In some embodiments, the interconnect metal 250 can be formed as strip segments so as to be electrically connected to the L-shaped conductors 246 but insulated from the substrate (including the intrinsic region 232). Such an interconnect metal 250 can be formed by, for example, patterned metal deposition on top of an insulating layer. For example, and as described in greater detail herein in reference to FIG. 7C, a metal layer 282 can be formed on a substrate 232 so as to form an ohmic contact to facilitate one or more features of ESD functionalities as described herein. In the context of the example shown in FIGS. 5 and 6, the metal layer 282 can be formed so as to yield the example "L" shaped discharge structure. The metal layer 282 can be covered with a dielectric layer (e.g., silicon nitride). The dielectric layer can be etched open (e.g., by photolithographic method) so as to expose at least a portion of the "L" shaped metal layer 282. Then, an interconnect metal layer 284 can be formed so as to be in electrical contact with the ohmic metal 282. In the example configuration of FIGS. 5 and 6, the interconnect metal layer 284 is depicted as interconnecting (250) the ohmic metal structures (246) to the via 252. Outside of the exposed opening for electrical contact with the ohmic metal 282, the interconnect metal layer 284 can remain above the dielectric layer so as to be separated from the semiconductor substrate. In the example shown in FIG. 7C, an additional metal layer 286 can be formed so as to provide a desired interconnection conductivity property. In some implementations, either or both of the metal layers 284, 286 can be configured so as to provide a mechanical structure that reduces likelihood of delamination of one or more dielectric layers from the substrate. Examples of such a feature are described herein in greater detail.

Figure 7B:
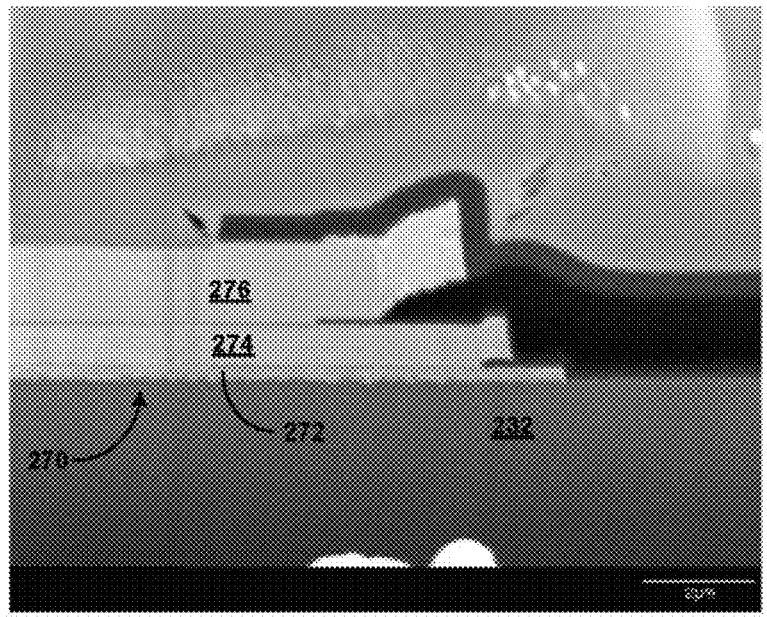
FIG. 7B shows a closer sectional view of the first conductor of the ESD structure of FIG. 7A.
Figure 7C:
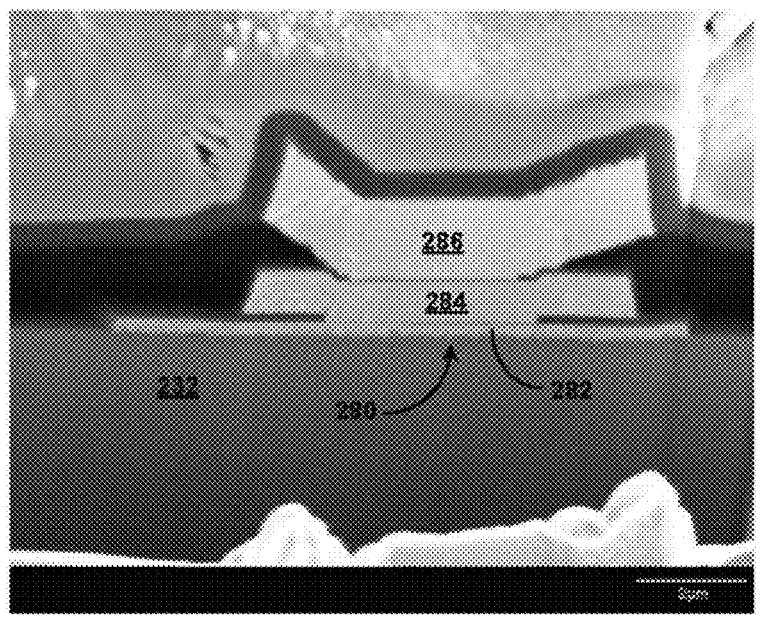
FIG. 7C shows a closer sectional view of the second conductor of the ESD structure of FIG. 7A.

FIGS. 7A-7C show examples of how the first and second conductors similar to those of FIGS. 5 and 6 can be formed. FIG. 7A is a photograph of an ESD structure 240 having a first conductor 244 and a second conductor 246. A sectional cut was made to show sectional views of a layer assembly 270 of the first conductor 244 and a layer assembly 280 of the second conductor 246. In FIG. 7A, although the reference numeral 232 for the intrinsic semiconductor region is indicated on the surface, such an intrinsic region may or may not extend to the outer surface. For example, there may be a protective layer that forms the outer surface. In some embodiments as described herein, an insulating surface layer between the first and second conductors 244, 246 is preferred, so that an ESD charge pathway goes through the intrinsic semiconductor region underneath the surface.

FIG. 7B shows an enlarged sectional view of the layer assembly 270 of the first conductor 244 of FIG. 7A. FIG. 7C shows an enlarged sectional view of the layer assembly 280 of the second conductor 246 of FIG. 7A.

FIG. 7B shows that in some implementations, the layer assembly 270 of the first conductor 244 can be formed so as to provide an ohmic contact between a bond pad surface of a metal layer 276 and the intrinsic semiconductor region 232. Such an assembly can include an ohmic metal layer 272 formed on a surface of the intrinsic semiconductor region 232. Such an ohmic metal layer 272 can be formed from, for example, NiGeAu by a deposition technique such as sputter deposition, and can have a thickness in a range of approximately 100 nm to 500 nm. The example ohmic metal layer 272 shown in FIG. 7B has a thickness of about 300 nm. Other materials and/or other thicknesses can also be implemented.

The layer assembly 270 can further include a metal layer (274) formed so as to be in electrical contact with the ohmic metal 272. In some embodiments, an additional metal layer 276 can be formed over the metal layer 274 so as to yield a desired shaped first conductor (244 in FIG. 7A) that is in electrical contact with the ohmic metal layer 272.

FIG. 7C shows that in some implementations, the layer assembly 280 of the second conductor 246 can be formed so as to provide an ohmic contact between a conductive strip (284 and/or 286) and the intrinsic semiconductor region 232. Such an assembly can include an ohmic metal layer 282 formed on a surface of the intrinsic semiconductor region 232. Such an ohmic metal layer 282 can be formed from, for example, NiGeAu by a deposition technique such as sputter deposition, and can have a thickness in a range of approximately 100 nm to 500 nm. The example seed layer shown in FIG. 7C has a thickness of about 300 nm. Other materials and/or other thicknesses can also be implemented.

As previously described in reference to FIGS. 5 and 6, the layer assembly 280 can further include an interconnect metal layer 284 formed so as to be in electrical contact with the ohmic metal 282. The interconnect metal layer can be formed by, for example, covering the metal layer 282 (e.g., with a dielectric layer such as silicon nitride) and etching a desired opening in the dielectric layer (e.g., by photolithographic method) so as to expose at least a portion of the ohmic metal layer 282. Then, the interconnect metal layer 284 can be formed so as to be in electrical contact with the ohmic metal 282. In the example configuration of FIGS. 5 and 6, the interconnect metal layer 284 is depicted as interconnecting the "L" shaped ohmic metal structures to the via 252. Outside of the exposed opening for electrical contact with the ohmic metal 282, the interconnect metal layer 284 can remain above the dielectric layer so as to be separated from the semiconductor substrate. In the example shown in FIG. 7C, an additional metal layer 286 can be formed so as to provide a desired interconnection conductivity property.

In some implementations, various layers associated with the first and second conductor structures can be formed together. Upon such formation of the layers, the first and second conductors can be separated by, for example, patterned etching to yield desired shapes of the first and second conductors. In some implementations, the first and second conductors can be formed substantially independently from each other. In some implementations, the first and second conductors can be formed in any combination of the foregoing.

Figure 8:
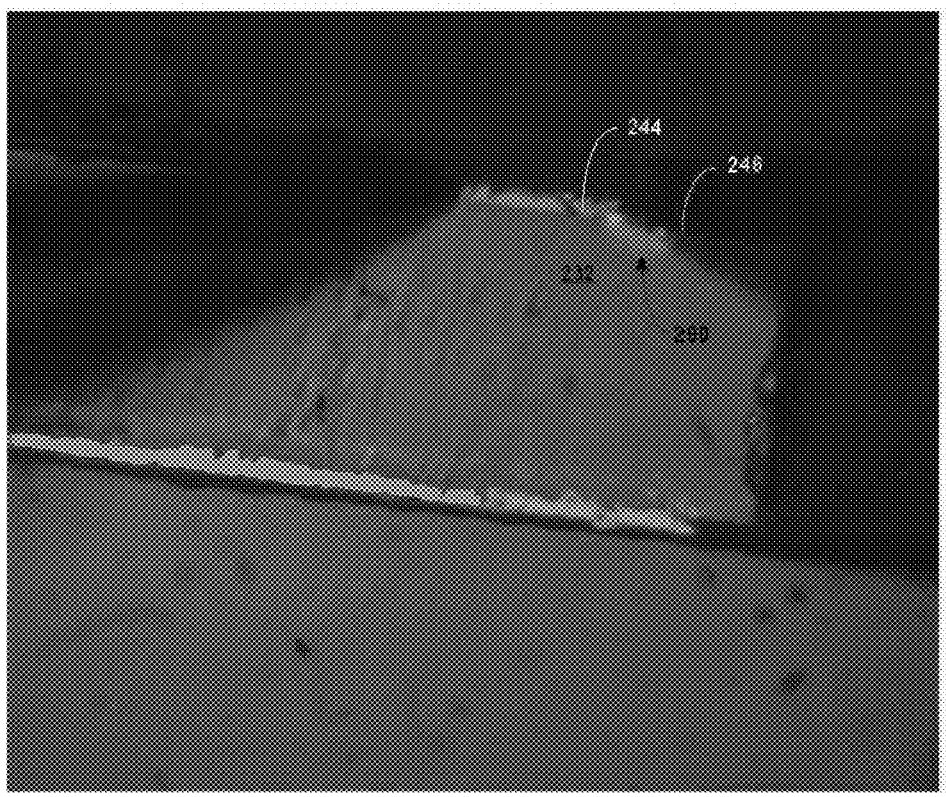
FIG. 8 shows a photograph of a section of an example ESD, where an electrical current flow is shown to occur between the first and second conductors.

FIG. 8 shows a photograph of a photoemission image of a cross-section of an ESD structure under bias. To obtain the image, the ESD structure was cross-sectioned, and probes were placed on ohmic-metal conductor structures 244, 246 to provide the bias between the two conductors. The substrate between the two conductors 244, 246 is a bulk intrinsic GaAs semiconductor (indicated as 232).

In the example photoemission image shown in FIG. 8, the brightest emissions are at the metal-semiconductor junctions, likely due to surface states of the semiconductor that can be generated by the disruption of the lattice during the metal-semiconductor alloy process. Dim emissions at various locations of the bulk intrinsic region are also visible; and these emissions are possibly due to recombinations of electrons with crystal defects.

As further shown in FIG. 8, a curved emission pattern 290 indicates flow of charge between the two conductors 244, 246 through the bulk intrinsic GaAs region 232. Such an emission pattern turned on when the potential difference between the two conductors 244, 246 exceeded about 36 volts. It will be understood that the turn-on voltage can be at other values or ranges, depending on configuration of the two conductors and/or the bulk intrinsic region.

One or more features associated with various ESD structures described herein can be implemented in integrated circuit devices and/or other devices, whether or not such devices are RF based devices. For example, a non-RF device having an intrinsic semiconductor region can be provided with first and second conductors so as to form a charge pathway that can be selectively turned on to provide ESD protection.

Figure 9A:
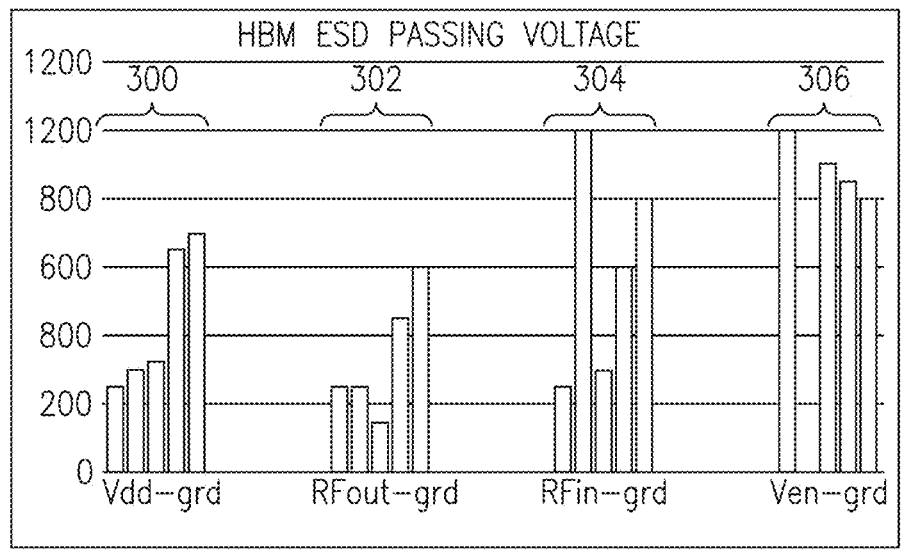
FIGS. 9A and 9B show that in some embodiments, an ESD structure having one or more features as described herein can be particularly useful when implemented at or near an RF input location.
Figure 9B:
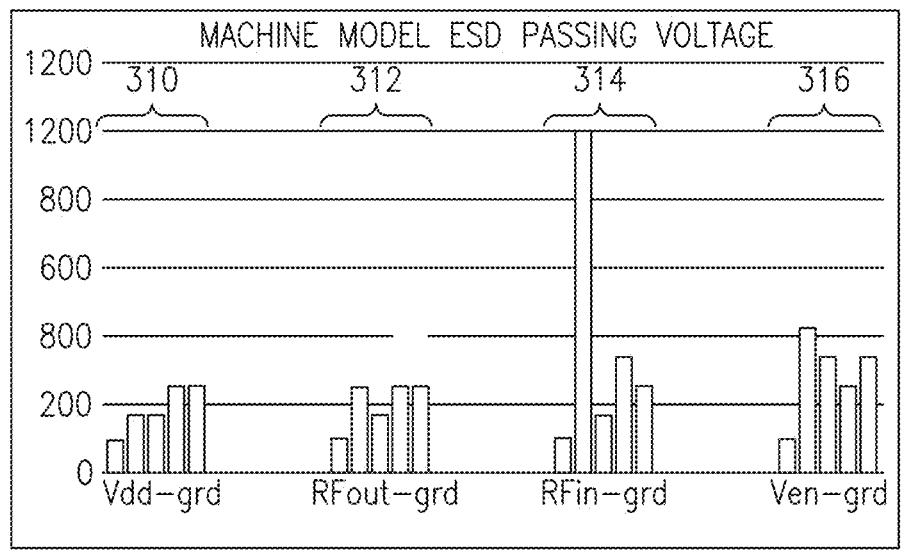

In some implementations, one or more features as described herein can be particularly advantageous when utilized in RF-related devices. Examples of how such one or more features can provide effective ESD protection in a manner that reduces or substantially eliminates RF-impact are described in reference to FIGS. 9 and 10. FIG. 9A shows an example of how ESD structures positioned at different portions of an MMIC can provide different effectiveness when subjected to a human body model (HBM) ESD test. FIG. 9B shows an example of how ESD structures positioned at different portions of an MMIC can provide different effectiveness when subjected to a machine model (MM) ESD test.

In FIG. 9A, where example HBM ESD test results are shown, groups 300, 302, 304 and 306 correspond to bond pads associated with Vdd (power supply, 244a in FIG. 5), RFout (RF output, 244b), RFin (RF input, 244c) and Ven (enable, 244d), respectively. Within each group, the five bars represent the following example configurations: Left bar represents a prototype circuit without an ESD device; the second bar from left represents a production circuit with an ESD as described herein (e.g., a benign discharge structure); the middle bar represents a production version of the prototype configuration (left bar); the second bar from right represents a prototype circuit with separate ESD diodes at Vdd and Ven locations; and the right bar represents a combination of the benign discharge structure (BDS) and the ESD diodes. The machine model results shown in FIG. 9B have similar groups (310, 312, 314, 316) and arrangements of the five bars.

It is noted that in both HBM and MM cases, the configuration having an ESD structure (second bar from the left) is significantly more effective at the RFin pin (groups 304, 314 in FIGS. 9A and 9B) than at other pins. For the RFout pin (groups 302, 312), the ESD structure (second bar) is shown to provide improved ESD voltage performance than those examples without any ESD devices (left bar and middle bar). However, the improvement is not as pronounced as in the RFin case. Such a difference in ESD voltage performance may be due to the RFin pad having connected to it a large MIM capacitor, while the RFout pad has connected to it a smaller capacitor. Accordingly, in some implementations, an ESD structure as described herein can be provided at or near RF ports where charge collecting capabilities already exist. As demonstrated in the foregoing example measurements, a larger charge collecting capability (e.g., large capacitor of RFin) can further enhance the performance of the ESD structure.

In some implementations, it can be desirable to have an ESD structure that has a reduced or substantially nil impact on one or more operating parameters (e.g., RF related parameters such as capacitance, inductance, etc.) For the purpose of description herein, such an impact on RF related parameter(s) is sometimes referred to as being benign. As described herein in greater detail, various embodiments of an ESD structure having an intrinsic semiconductor interposed between two conductors can provide such benign-ness for RF devices while providing an effective ESD protection functionality.

To demonstrate desirability of the foregoing combination of robust ESD protection capability and benign-ness, consider the example results for Ven shown in FIGS. 9A and 9B. In the example RF device associated with FIGS. 9A and 9B, the Ven pin (a DC input) has associated with it a separate ESD protection diode that provides robust ESD protection for the Ven pin. However, such a diode is not desirable at RF ports (input and output) due to noise(s) and/or other undesirable RF effects generated by or induced by the diode. Accordingly, the RFin pin in the example is not equipped with such a separate ESD protection diode; and if not provided with an ESD protection structure (e.g., original and production lot cases), ESD voltage performance is relatively poor. However, with an ESD protection structure (second bar from the left) provided at the RFin pin, ESD voltage performance significantly exceeds those of other configurations. The benign-ness of the ESD structure at the RFin pin is described in greater detail in reference to FIGS. 10A and 10B.

Figure 10A:
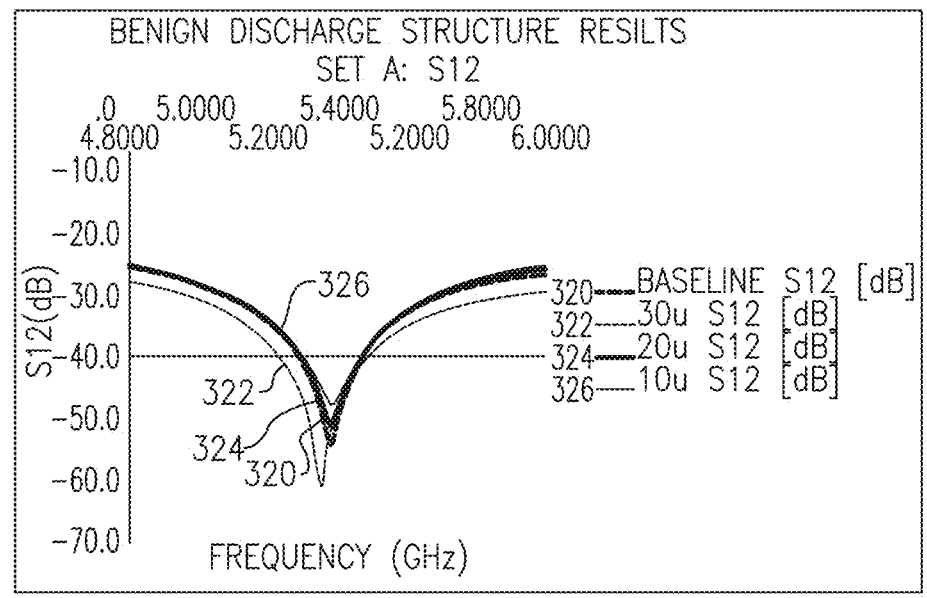
FIGS. 10A and 10B show that in some embodiments, an ESD structure having one or more features as described herein can be substantially benign with respect to various RF functionalities of an RF device while providing ESD protection.
Figure 10B:
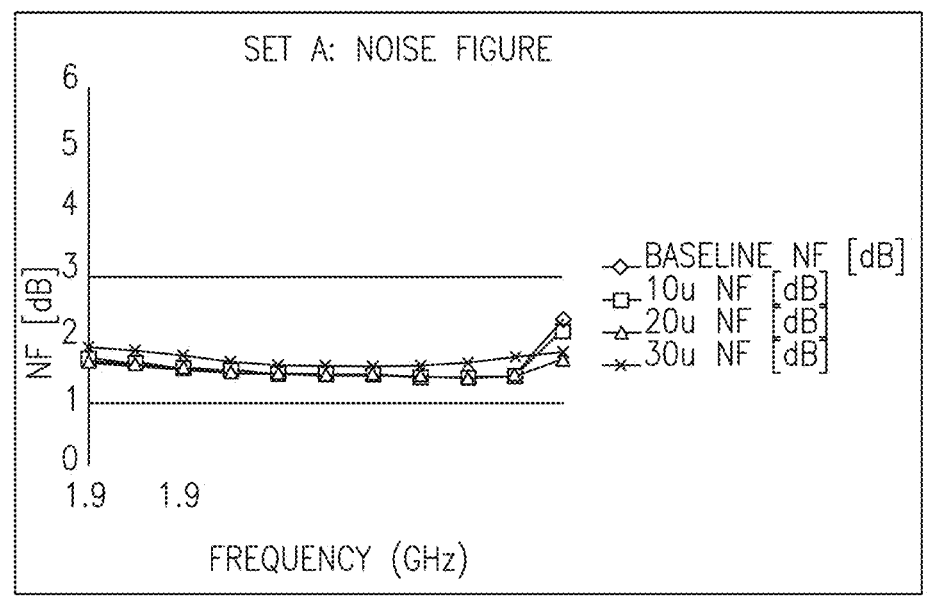

In some implementations as described herein, an ESD structure can provide effective protection while having little or substantially nil effect on one or more RF-related performance parameters. FIGS. 10A and 10B show examples of such performance parameters.

FIG. 10A shows an example of how an ESD structure as described herein can provide protection while having little or substantially nil effect on a frequency-dependent S12 parameter of an example low-noise amplifier (LNA). In FIG. 10A, a baseline S12 profile 320 corresponds to a configuration where an RFin does not have an ESD structure. S12 profiles 322, 324 and 326 correspond to configurations where ESDs are separated from the pads by approximately 30 μm, 20 μm and 10 μm, respectively. One can see that the 20 μm case is very similar to the baseline case; and the other two cases (10 μm and 30 μm cases) are also quite similar.

FIG. 10B shows another example of how an ESD structure can provide protection while having little or substantially nil effect on frequency-dependent noise of the example LNA. In FIG. 10B, a baseline gain profile 330 corresponds to a configuration where an RFin does not have an ESD structure. Gain profiles 332, 334 and 336 correspond to configurations where ESDs are separated from the pads by approximately 10 μm, 20 μm and 30 μm, respectively. One can see that the 10 μm and 20 μm cases are very similar to the baseline case for most of the frequency range; and the 30 μm case is also quite similar.

Figure 11:
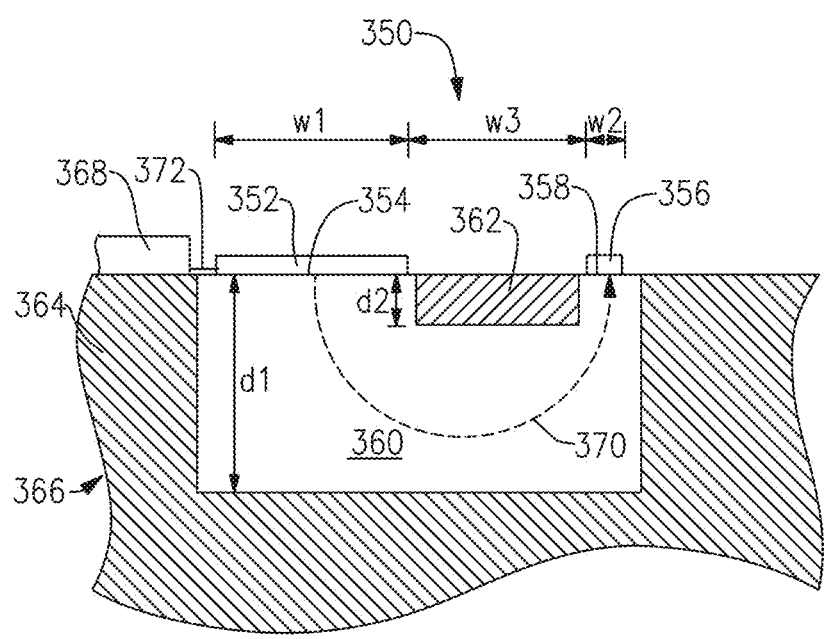
FIG. 11 shows that in some implementations, an ESD structure can be configured in a number of different ways to provide different advantageous features.

FIG. 11 shows an example configuration of a benign discharge structure 350 that can provide one or more advantageous features as described herein. The structure 350 can be formed on a semiconductor substrate 366 having an intrinsic region 360. First and second conductors 352, 356 can form ohmic contacts 354, 358 with the intrinsic region 360 so as to yield a discharge path 370 between the two conductors (352, 356) through the intrinsic region 360. As described herein, such conductors (352, 356) can be dimensioned and separated so as to provide functionalities such as benign-ness and likely direction of discharge. In FIG. 11, such dimensions can be as follows: w1 represents a lateral width dimension of the first conductor 352, w2 represents a lateral width dimension of the second conductor 356, and w3 represents an edge-to-edge separation of the first and second conductors.

The benign discharge structure can further include an insulating region 362 formed between the first and second conductors 352, 354. Such an insulating region can be formed by, for example, doping (e.g., Boron implantation) or other known methods. In some implementations, such an insulating region can result in ESD-related charge to be built up in and travel through the bulk of the intrinsic region 360 instead of at or near the surface. In some embodiments, depth (d2) of the insulating region 362 can be selected to control how deep the discharge path 370 should be. In FIG. 11, the insulating region 362 is depicted as having a box-like shape for illustration purpose; but it will be understood that the region 362 can have other shapes.

The benign discharge structure can further include one or more insulating regions about the intrinsic region 360, dimensioned to further define the discharge path 370. In the example depicted in FIG. 11, such an insulating region is indicated as 364; and such a region can be formed by appropriate doping (e.g., Boron implantation) or other known methods. In some embodiments, depth (d1) of the intrinsic region's 360 lower boundary can also be selected to control charge build-up capability (in the intrinsic region) and how deep the discharge path 370 should be. Further, in the example shown in FIG. 11, the intrinsic region 360 being bounded on the left side by the insulating region 364 can inhibit discharge being routed to a region beneath RF components.

In the example shown in FIG. 11, the portion of the intrinsic region 360 beneath the first conductor 352 (e.g., a bond pad) is significantly wider than the portion beneath the second conductor 356. Accordingly, the region beneath the first conductor has a larger volume, and thus greater charge receiving capacity. Thus, when an ESD event occurs near the first conductor 352, the larger charge-receiving capacity of the intrinsic region below the first conductor 352 makes it likely that the ESD-related charge will enter the first conductor 352 like a funnel instead of another nearby location. Once in the funnel-like pathway, the appropriately shaped intrinsic region (turned on by the potential difference resulting from the ESD event) can guide the charge to the second conductor (and to a ground) and away from the RF components.

As described herein, a benign discharge structure can be formed near an existing device having a charge holding capability so as to enhance charge-receiving capability as well as increasing the likelihood that ESD-related charge will indeed be received there first. In the example configuration shown in FIG. 11, the first conductor 352 (e.g., a bond pad) is depicted as being electrically interconnected (372) to a relatively large capacitor 368. In some embodiments, one or more other devices can also be utilized.

In some embodiments, a benign discharge structure having one or more of the foregoing features can be implemented so as to not only provide substantial benign-ness, but also to do so with very small area commitment. In the example shown in FIGS. 5 and 6, the second conductors 246 and their interconnects 250 are thin metal strips formed near bond pads and near the perimeter of the device 230. Accordingly, the original arrangement and spacing of various components of the device 230 can be substantially retained or be adjusted minimally.

Figure 12:
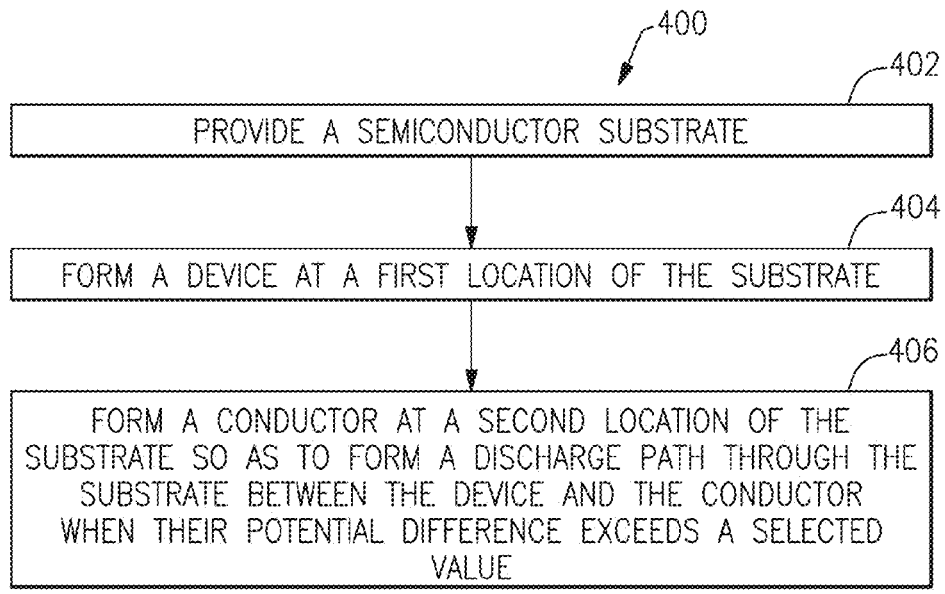
FIG. 12 shows a process that can be implemented to fabricate an ESD structure having one or more features as described herein.

FIG. 12 shows a process 400 that can be implemented to fabricate a discharge structure having one or more features described herein. In block 402, a semiconductor substrate can be provided. In some embodiments, such a substrate can include an intrinsic semiconductor portion. In block 404, a device can be formed or provided at a first location of the substrate. In some embodiments, such a device can include one or more conductive portions that form ohmic contact(s) with an intrinsic semiconductor portion of the substrate. In block 406, a conductor can be formed or provided at a second location of the substrate so as to form a discharge path through the substrate between the device and the conductor when their potential difference exceeds a selected value. In some embodiments, such a conductor can form ohmic contact with the intrinsic semiconductor portion of the substrate, such that the discharge path is through the intrinsic portion.

Figure 13:
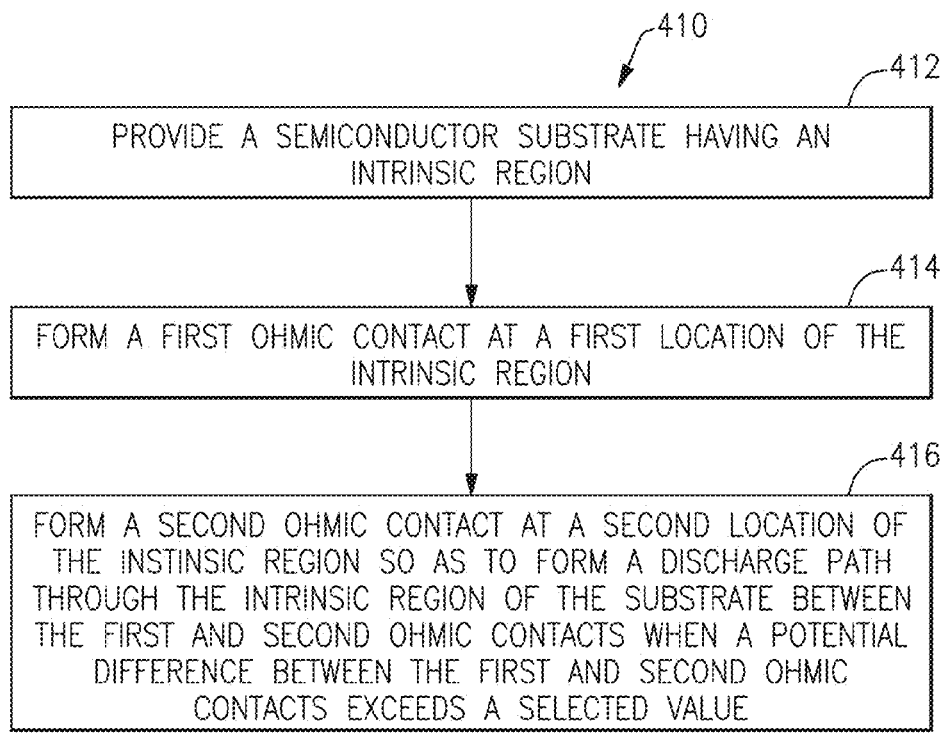
FIG. 13 shows a process for fabricating an ESD structure where first and second conductors can form ohmic contacts with an intrinsic semiconductor.

In the context of the foregoing example where the device and the conductor form ohmic contacts with the intrinsic semiconductor substrate, FIG. 13 shows that a process 410 can be implemented to fabricate a discharge structure. In block 412, a semiconductor substrate having an intrinsic region can be provided. In block 414, a first ohmic contact can be formed at a first location of the intrinsic region. In block 416, a second ohmic contact can be formed at a second location of the intrinsic region so as to form a discharge path between the two ohmic contacts through the intrinsic region of the substrate. Such a discharge path can be configured to turn on when a potential difference between the two ohmic contacts exceeds a selected value.

For the purpose of description herein, an intrinsic semiconductor can include, but not limited to, GaAs substrate upon which epitaxial growth process(es) is/are performed. In some embodiments, an intrinsic semiconductor can include, but not limited to, GaAs substrate which does not have significant concentration of dopants such as Boron.

One or more features of the present disclosure can be implemented in a number of semiconductor materials. Such semiconductors can include, but are not limited to, gallium arsenide (GaAs), silicon, any other semiconductors that can be implemented in a substantially intrinsic form. For example, in silicon-on-insulator (SOI) processes, there may be situations where at least a portion of a silicon substrate may not be doped. Accordingly, a discharge structure having one or more features as described herein can be implemented in such a configuration.

As described herein in reference to FIGS. 5-7, an interconnect conductor that interconnects one or more ohmic metal contacts to ground can be configured to reduce the likelihood of a dielectric layer de-laminating from an edge. De-lamination of layers such as a dielectric layer typically starts from an edge of the dielectric layer (e.g., at a street that defines an edge of the dielectric layer).

In some implementations, an interconnect conductor that interconnects one or more ohmic metal contacts as described herein can be formed so as to form a perimeter around a given area. For the purpose of description, it will be understood that such a perimeter may or may not form a complete enclosure of the area. For example, even if such a perimeter of interconnect conductor does not form a continuous enclosure, sufficient mechanical functionality for inhibiting edge-started de-lamination can be provided.

Figure 14:
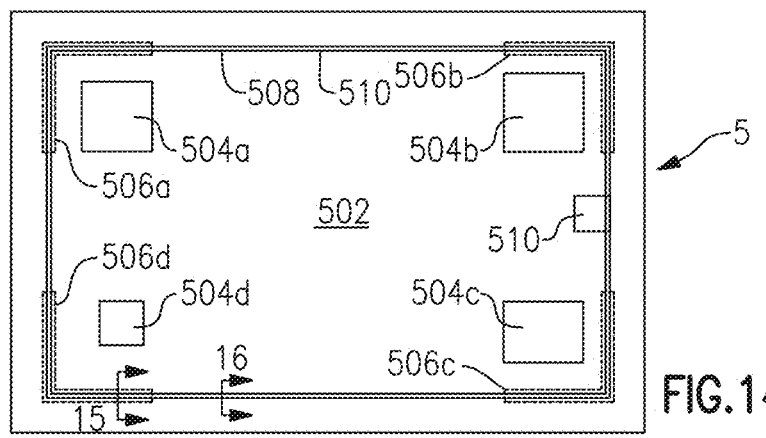
FIG. 14 shows that in some implementations, an interconnect conductor that interconnects one or more ESD structures can be configured to reduce likelihood of de-lamination of a dielectric layer.

FIG. 14 shows an example die 500 having a plurality of first ohmic contact conductors 504 formed on an intrinsic semiconductor substrate as described herein. Also shown are a plurality of second ohmic contact conductors 506 also formed on the intrinsic semiconductor substrate as described herein so as to provide an ESD pathway between the first and second ohmic contacts through the intrinsic semiconductor. A dielectric layer 502 is shown to be formed on the intrinsic semiconductor substrate, and one or more interconnect conductors 508, 510 are shown to be formed so as to interconnect the second ohmic contacts 506 to a ground through, for example, a through-wafer via 510. The one or more interconnect conductors 508, 510 can be electrically connected to the second ohmic contacts 506 through openings formed on the dielectric layer 502. FIG. 15 shows example sectional views at such a location. Away from the second ohmic contacts 506, the one or more interconnect conductors 508, 510 can be separated from the intrinsic semiconductor substrate by the dielectric layer 502. FIG. 16 shows an example sectional view at such a location.

Figure 15A:
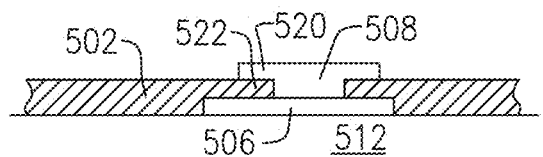
FIGS. 15A-15C show sectional views of examples of the interconnect conductor of FIG. 14 formed over an ESD structure.
Figure 16:
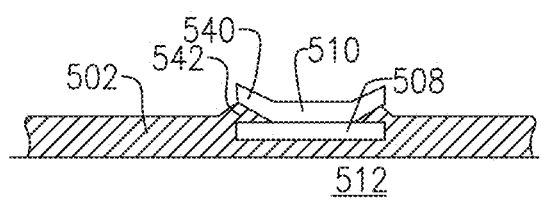
FIG. 16 shows a sectional view of an example of the interconnect conductor of FIG. 14 formed over a dielectric layer.

FIG. 15A shows a sectional view of an interconnect conductor 508 formed over an ohmic metal 506 which is formed on an intrinsic semiconductor substrate 512. In some implementations, the ohmic metal 506 can be formed first on the substrate 512, followed by a dielectric layer 502 that covers the substrate 512 and the ohmic metal 506. To form the interconnect conductor 508 over the ohmic metal 506 so as to be in electrical contact, an opening can be formed by, for example, photolithographic method.

As shown in FIG. 15A, the interconnect conductor 508 can be formed so as to include a portion 520 that extends over an edge 522 of the dielectric layer 502. Such an overhang over the edge 522 can effectively pin down the edge 522 mechanically so as to prevent or reduce the likelihood of de-lamination of the dielectric layer 502, which often starts from an edge portion such as the example edge depicted as 522.

Figure 15B:
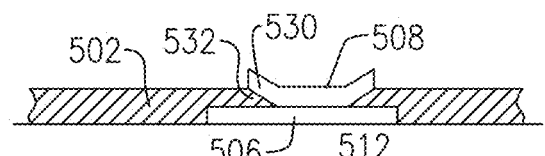

An extension of an interconnect conductor over an edge of a dielectric layer can be configured in a number of different ways. For example, FIG. 15B shows an example saw-tooth configuration where an interconnect conductor's (508) sectional shape includes an angled extension 530 that wedges an edge portion 532 of a dielectric layer 502. Such a configuration where the edge 532 is wedged under the angled extension 530 can also effectively pin down the edge 532 mechanically so as to prevent or reduce the likelihood of de-lamination of the dielectric layer 502.

The interconnect conductor 508 is depicted as being formed over an ohmic metal 506 which is in turn formed over an intrinsic semiconductor substrate 512. Formations of the ohmic metal 506, the dielectric layer 502, and the opening in the dielectric layer 502 can be achieved in manners similar to those described in reference to FIG. 15A.

Figure 15C:
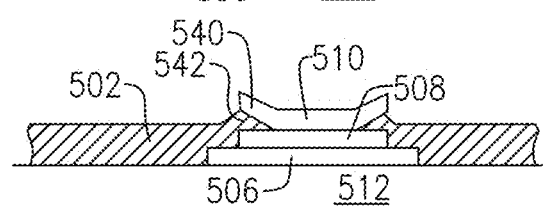

As described herein in reference to FIG. 7C, a second interconnect conductor can be formed over a first interconnect conductor so as to achieve a desired conduction property. FIG. 15C shows an example where a first interconnect conductor 508 is formed over an ohmic metal 506. A second interconnect conductor 510 is shown to be formed over the first interconnect conductor 508. The second interconnect conductor 510 can include an angled extension 540 that wedges an edge portion 542 of a dielectric layer 502. Such a saw-tooth configuration where the edge 542 is wedged under the angled extension 540 can also effectively pin down the edge 542 mechanically so as to prevent or reduce the likelihood of de-lamination of the dielectric layer 502. Formations of the ohmic metal 506 on an intrinsic semiconductor substrate 512, the dielectric layer 502, and the openings in the dielectric layer 502 for forming the first and second interconnect conductors can be achieved in manners similar to those described in reference to FIG. 15A.

As described herein, one or more layers of interconnect conductors can be formed over a dielectric layer so as to be separated from an intrinsic semiconductor substrate. For such a portion of the one or more interconnect conductors, FIG. 16 shows an example where a first interconnect conductor 508 is formed over a dielectric layer 502 such that the first interconnect conductor 508 is separated from an intrinsic semiconductor substrate 512. A second interconnect conductor 510 is shown to be formed over the first interconnect conductor 508. The second interconnect conductor 510 can include an angled extension 540 that wedges an edge portion 542 of a dielectric layer 502. Such a saw-tooth configuration where the edge 542 is wedged under the angled extension 540 can also effectively pin down the edge 542 mechanically so as to prevent or reduce the likelihood of de-lamination of the dielectric layer 502. Formations of the dielectric layer 502 over the substrate 512, and formations of the first and second interconnect conductors 508, 510 can be achieved in manners similar to those described in reference to FIG. 15C.

Figure 17:
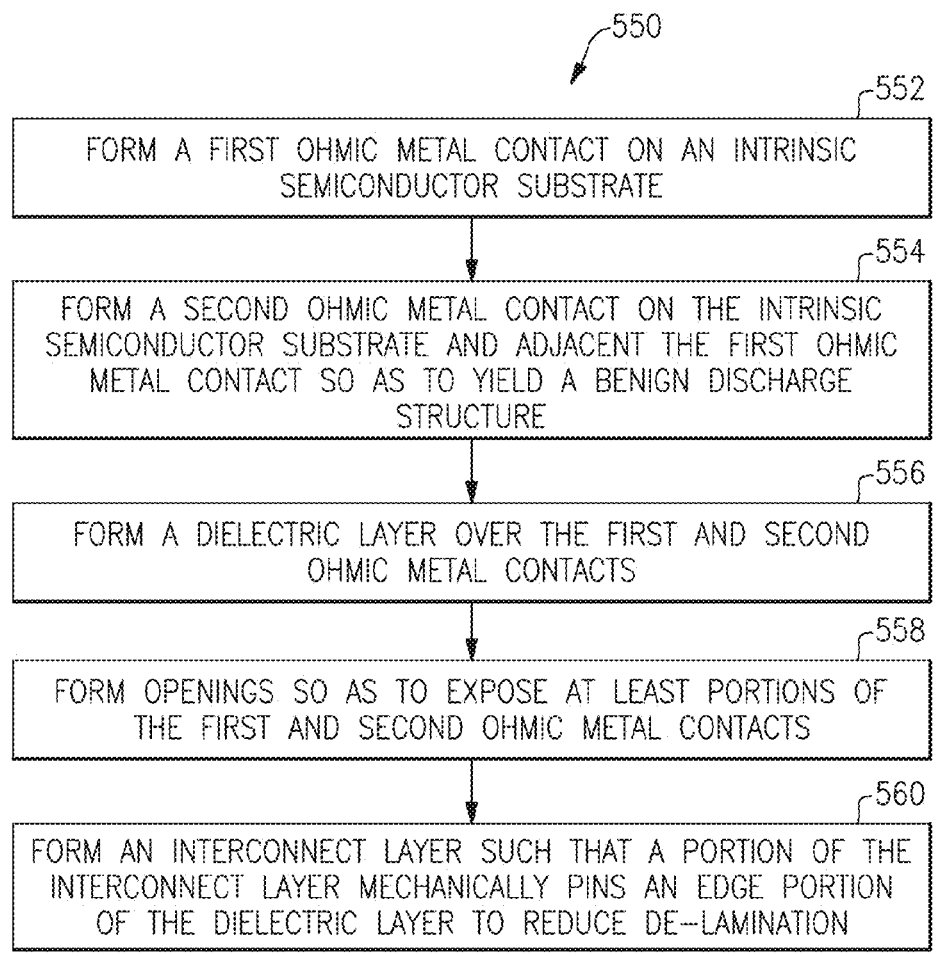
FIG. 17 shows a process that can be implemented to fabricate a de-lamination-resistant structure as described herein.

FIG. 17 shows a process 550 that can be implemented to fabricate a device that includes a de-lamination resistance feature as described herein. Although described in the context of a benign discharge structure, it will be understood that one or more features associated with such de-lamination resistance can be implemented without such an ESD structure.

In block 552, a first ohmic metal contact can be formed on an intrinsic semiconductor substrate. In block 554, a second ohmic metal contact can be formed on the intrinsic semiconductor substrate and adjacent the first ohmic metal contact so as to yield a benign discharge structure. In block 556, a dielectric layer can be formed over the first and second ohmic metal contacts. In block 558, openings can be formed in the dielectric layer so as to expose at least portions of the first and second ohmic metal contacts. In block 560, an interconnect layer can be formed so as to be electrically connected to the second ohmic contact, and such that a portion of the interconnect layer mechanically pins an edge portion of the dielectric layer to thereby inhibit or reduce the likelihood of de-lamination of the dielectric layer.

In some implementations, a dielectric layer described herein can be configured to function as a passivation layer. Thus, in some embodiments, a dielectric layer can be referred to as a passivation layer.

Figure 18:
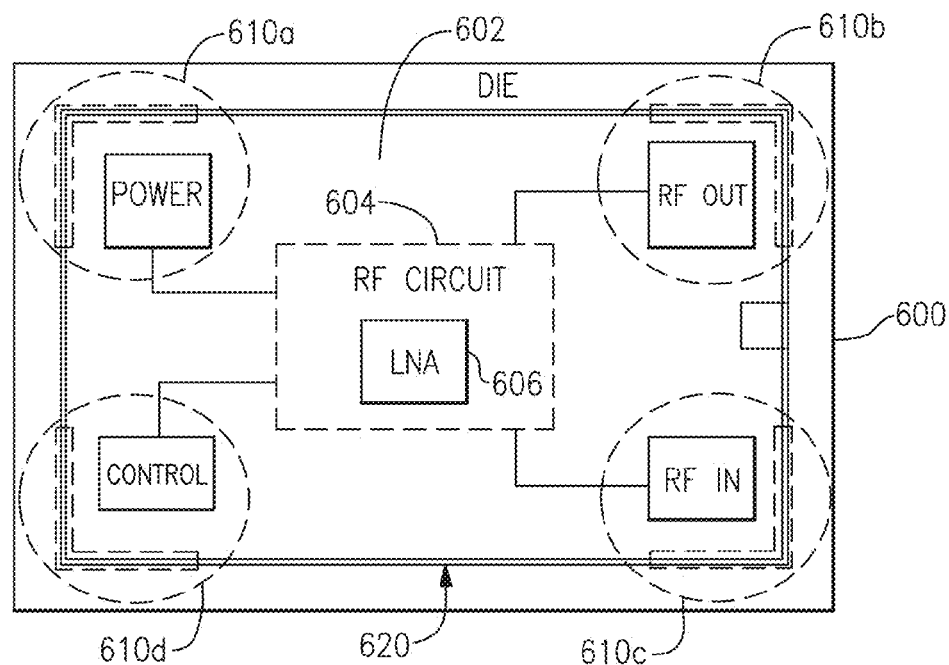
FIG. 18 shows that in some embodiments, one or more features of the present disclosure can be implemented on a semiconductor die.

In some implementations, devices and/or circuits having one or more features described herein can be included in a semiconductor die, such as an example die 600 schematically depicted in FIG. 18. The die 600 can include a semiconductor substrate 602 configured to receive a plurality of components. As described herein, such a substrate can include at least some intrinsic portions to facilitate ESD pathway(s) at, for example, ESD structures 610a, 610b, 610c, 610d.

The die 600 can include an RF circuit 604, and such a circuit can be interconnected to contact pads such as "RF in," "RF out," "Power," and "Control." At least some of such contact pads can be part of the ESD structures 610. In some embodiments, the ESD structures 610 can be configured as described herein to provide ESD protection while having little or no impact on RF functionality of the RF circuit 604 or the die 600 itself. For such a configuration, at least the "RF in" and "RF out" contact pads can be provided with second ohmic contacts as described herein to provide ESD protection. As described herein, the "RF in" portion can benefit significantly from the ESD structures as described herein. Accordingly, in some embodiments, the die 600 can include an ESD structure 610 at least for the "RF in" portion.

In some implementations, the RF circuit 604 can include a low-noise amplifier (LNA) 606 configured to receive and amplify relatively weak RF signals received by an antenna. Such an amplifier can be sensitive to RF parameters such as noise figure and s-parameter(s). As described herein, robust ESD protection can be provided for RF circuits such as an LNA circuit while providing little or no impact on such RF parameters.

The foregoing LNA being part of the RF circuit 604 is intended to be an example and not a requirement. In some implementations, the RF circuit 604 may or may not include an LNA. In some implementations, the RF circuit 604 can include any circuit that can benefit from ESD protection that has little or no impact on RF the circuit's RF operation. Such a circuit can include, for example, an LNA circuit, a power amplifier circuit, a switching circuit, one or more control circuits, a transmitter circuit, and a receiver circuit.

Figure 19:
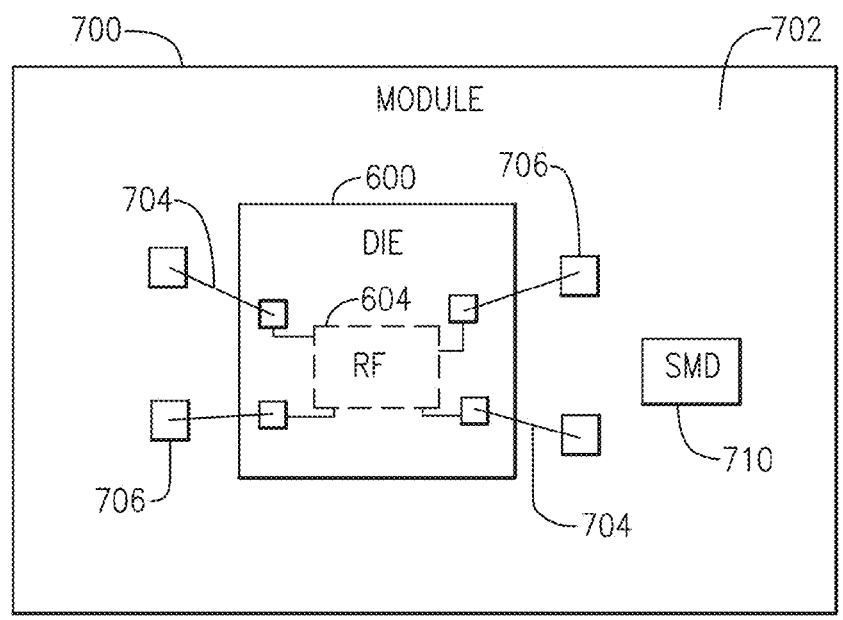
FIG. 19 shows that in some embodiments, one or more features of the present disclosure can be implemented in a packaged RF module.

In some implementations, a semiconductor die having one or more features described herein can be included in a module. FIG. 19 shows an example module having a die described in reference to FIG. 18.

In the example shown in FIG. 19, a module 700 can include a packaging substrate 702 configured to receive a plurality of components. In some embodiments, the packaging substrate 702 can include a laminate substrate. Such components can include a die 600 as described herein.

The die 600 can include an RF circuit 604 (e.g., an LNA circuit) and a plurality of contact pads. As described herein, at least some of such contact pads can be part of ESD structures configured to provide ESD protection with little or no impact on RF operation of the RF circuit 604. Such contact pads can facilitate formation of electrical connections (e.g., wirebonds) 704 with corresponding contact pads 706 on the packaging substrate 702. The contact pads 706 can be electrically connected to other contact pads disposed at other portions of the module 700 to thereby facilitate electrical connections between the die 600 and components external to the module 700.

In some embodiments, the module 700 can also include one or more surface-mount devices (SMD) 710 mounted on the packaging substrate 702 and configured to facilitate and/or complement the functionality of the RF circuit 604 to thereby yield a desired functionality of the module 700.

In some embodiments, the module 700 can also include one or more packaging structures to, for example, provide protection and facilitate easier handling of the module 700. Such a packaging structure can include an overmold formed over the packaging substrate 702 and dimensioned to substantially encapsulate the various circuits and components thereon.

It will be understood that although the module 700 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 20:
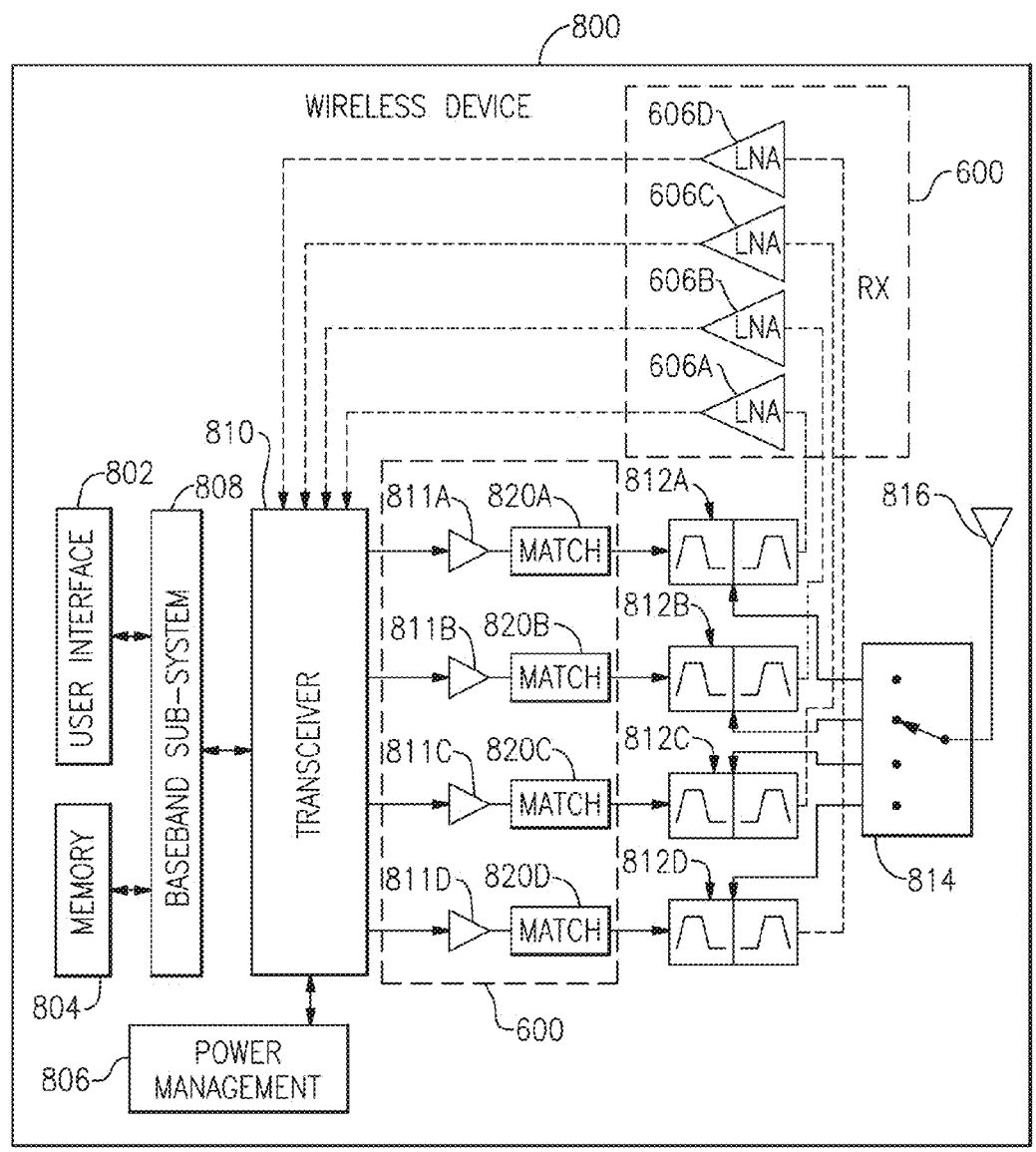
FIG. 20 shows that in some embodiments, one or more features of the present disclosure can be implemented in a wireless device.

FIG. 20 schematically depicts an example wireless device 800 having one or more advantageous features described herein. In the context of an LNA, one or more LNAs 606 as described herein are shown to receive RF signals from an antenna 816 through a switch 814 and their respective duplexers 812. Such LNAs and related channels can facilitate, for example, multi-band operation of the wireless device 800. In embodiments where the LNAs and the related ESD structures as described herein are packaged into a module, such a module can include components in a dashed box 600.

The LNAs 606 are shown to pass their amplified signals to a transceiver 810 for further processing by a receiver circuit (not shown). The transceiver 810 can also generate RF signals for transmission and pass such signals to power amplifiers (PAs) 811. Outputs of the PAs 811 are shown to be matched (via match circuits 820) and routed to the antenna 816 via their respective duplexers 812a-812d and the band-selection switch 814. The band-selection switch 814 can include, for example, a single-pole-multiple-throw (e.g., SP4T) switch to allow selection of an operating band (e.g., Band 2). In some embodiments, each duplexer 812 can allow transmit and receive operations to be performed simultaneously using a common antenna (e.g., 816).

In embodiments where the PAs and the related ESD structures as described herein are packaged into a module, such a module can include components in a dashed box 600. As described herein, other components of the wireless device 800 can include one or more ESD structures as described herein; and such components can be implemented in one or more modules. Accordingly, other dashed box(es) 600 in addition to or in place of the examples associated with the LNAs and the PAs can also be provided.

The transceiver 810 is also shown to interact with a baseband sub-system 808 that is configured to provide conversion between data and/or voice signals suitable for a user and RF signals suitable for the transceiver 810. The transceiver 810 is also shown to be connected to a power management component 806 that is configured to manage power for the operation of the wireless device. Such power management can also control operations of the baseband sub-system 808 and the module(s) 600.

The baseband sub-system 808 is shown to be connected to a user interface 802 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a die having a semiconductor substrate with an intrinsic region;
a metal layer in direct contact with the intrinsic region;
a passivation layer disposed over and in contact with the metal layer and the intrinsic region, the passivation layer defining an opening dimensioned to expose at least a portion of the metal layer; and
an interconnect conductor disposed over and in contact with the metal layer and electrically connected to the metal layer through the opening, the interconnect conductor having a saw-tooth cross-section with a linear portion in contact with the metal layer along the length of the linear portion, and a pair of extensions that extend at a non-perpendicular angle from opposite ends of the linear portion and in opposite directions to proximal ends of the interconnect conductor, each of the pair of extensions having a distal surface that extends from the linear portion to a proximal end aligned with a proximal surface of the passivation layer, a proximal surface that extends from the linear portion to a proximal end spaced above and vertically aligned with the proximal end of the distal surface of the extension, and a vertical segment that extends between and connects the proximal ends of the distal and proximal surfaces of each extension, the pair of angled extensions extending over an edge of the opening of the passivation layer, each of the angled extensions wedging a wedge-shaped portion of the passivation layer thereunder to inhibit or reduce the likelihood of the passivation layer de-laminating from the edge.

2. The semiconductor device of claim 1 wherein the passivation layer includes a dielectric layer.

3. The semiconductor device of claim 1 wherein the interconnect conductor is connected to a ground.

4. The semiconductor device of claim 1 further comprising a radio-frequency circuit implemented on the die.

5. The semiconductor device of claim 4 further comprising a contact pad connected to the radio-frequency circuit and in ohmic contact with the intrinsic region, the contact pad and the metal layer configured so that a potential difference greater than a selected value between the contact pad and the metal layer results in a conduction path through the intrinsic region between the contact pad and the metal layer.

6. The semiconductor device of claim 5 wherein the conduction path includes a metal-semiconductor-metal junction.

7. The semiconductor device of claim 6 wherein the metal-semiconductor-metal junction of the conduction path is configured to provide a discharge path during an electrostatic discharge event.

8. The semiconductor device of claim 5 wherein the contact pad is configured to receive an input radio-frequency signal for the radio-frequency circuit.

9. The semiconductor device of claim 8 wherein the radio-frequency circuit includes a low-noise amplifier.

10. The semiconductor device of claim 1 wherein the interconnect conductor is configured as a strip that extends near a perimeter of the die.

11. The semiconductor device of claim 1 wherein the semiconductor substrate includes gallium arsenide.

12. A method for fabricating a semiconductor device, the method comprising:
providing a semiconductor substrate having an intrinsic region;
forming metal layer in direct contact with the intrinsic region;
forming a passivation layer over and in contact with the metal layer and the intrinsic region such that the passivation layer defines an opening dimensioned to expose at least a portion of the metal layer; and
forming an interconnect conductor over and in contact with the metal layer such that the interconnect conductor is electrically connected to the metal layer through the opening, the interconnect conductor having a sawtooth cross-section with a linear portion in contact with the metal layer along the length of the linear portion, and a pair of extensions that extend at a non-perpendicular angle from opposite ends of the linear portion and in opposite directions to proximal ends of the interconnect conductor, each of the pair of extensions having a distal surface that extends from the linear portion to a proximal end aligned with a proximal surface of the passivation layer, a proximal surface that extends from the linear portion to a proximal end spaced above and vertically aligned with the proximal end of the distal surface of the extension, and a vertical segment that extends between and connects the proximal ends of the distal and proximal surfaces of each extension, the pair of angled extensions extending over an edge of the opening of the passivation layer, each of the angled extensions wedging wedge-shaped portion of the passivation layer thereunder to inhibit or reduce the likelihood of the passivation layer de-laminating from the edge.

13. The method of claim 12 further comprising forming a radio-frequency circuit on the semiconductor substrate.

14. The method of claim 13 further comprising forming and connecting a contact pad to the radio-frequency circuit, the contact pad in ohmic contact with the intrinsic region, the contact pad and the metal layer configured so that a potential difference greater than a selected value between the contact pad and the metal layer results in a conduction path through the intrinsic region between the contact pad and the metal layer.

15. The method of claim 12 wherein the passivation layer includes a dielectric layer.

16. A radio-frequency module comprising:
a packaging substrate configured to receive a plurality of components; and
a semiconductor die mounted on the packaging substrate, the die including an intrinsic region, the die further including a metal layer in direct contact with the intrinsic region, the die further including a passivation layer disposed over and in contact with the metal layer and the intrinsic region, the passivation layer defining an opening dimensioned to expose at least a portion of the metal layer, the die further including an interconnect conductor disposed over and in contact with the metal layer and electrically connected to the metal layer through the opening, the interconnect conductor having a saw-tooth cross-section with a linear portion in contact with the metal layer along the length of the linear portion, and a pair of extensions that extend at a non-perpendicular angle from opposite ends of the linear portion and in opposite directions to proximal ends of the interconnect conductor, each of the pair of extensions having a distal surface that extends from the linear portion to a proximal end aligned with a proximal surface of the passivation layer, a proximal surface that extends from the linear portion to a proximal end spaced above and vertically aligned with the proximal end of the distal surface of the extension, and a vertical segment that extends between and connects the proximal ends of the distal and proximal surfaces of each extension, the pair of angled extensions extending over an edge of the opening of the passivation layer, each of angled extensions wedging a wedge-shaped portion of the passivation layer thereunder to inhibit or reduce the likelihood of the passivation layer de-laminating from the edge.

17. The module of claim 16 further comprising a ground plane electrically connected to the interconnect conductor.

18. The module of claim 17 further comprising a radio-frequency circuit implemented on the die.

19. The module of claim 18 further comprising a contact pad connected to the radio-frequency circuit and in ohmic contact with the intrinsic region, the contact pad and the metal layer configured so that a potential difference greater than a selected value between the contact pad and the metal layer results in a conduction path through the intrinsic region between the contact pad and the metal layer.

* * * * *